US010283037B1

(12) United States Patent
Far et al.

(10) Patent No.: US 10,283,037 B1
(45) Date of Patent: May 7, 2019

(54) DIGITAL ARCHITECTURE WITH MERGED NON-LINEAR EMISSION CLOCK SIGNALS FOR A DISPLAY PANEL

(71) Applicant: Apple Inc., Cupertino, CA (US)

(72) Inventors: Mohammad B. Vahid Far, San Jose, CA (US); Hopil Bae, Sunnyvale, CA (US); Hyunwoo Nho, Stanford, CA (US); Xiang Lu, Campbell, CA (US)

(73) Assignee: Apple Inc., Cupertino, CA (US)

( * ) Notice: Subject to any disclaimer, the term of this patent is extended or adjusted under 35 U.S.C. 154(b) by 266 days.

(21) Appl. No.: 15/249,283

(22) Filed: Aug. 26, 2016

Related U.S. Application Data

(60) Provisional application No. 62/233,250, filed on Sep. 25, 2015.

(51) Int. Cl.

| | |
|---|---|
| ***G09G 3/20*** | (2006.01) |
| ***G09G 3/32*** | (2016.01) |
| ***G11C 19/00*** | (2006.01) |

(52) U.S. Cl.
CPC ......... *G09G 3/2092* (2013.01); *G09G 3/2003* (2013.01); *G09G 3/2074* (2013.01); *G11C 19/00* (2013.01); *G09G 2310/027* (2013.01)

(58) Field of Classification Search
CPC combination set(s) only.
See application file for complete search history.

(56) References Cited

U.S. PATENT DOCUMENTS 6,404,533 B1 6/2002 Fergusson
7,423,661 B2 9/2008 Abe
2005/0134614 A1* 6/2005 Tomohara ............ G09G 3/2014 345/690
2007/0216628 A1* 9/2007 Ju ........................ G09G 3/2014 345/98
2008/0042936 A1* 2/2008 Wang ....................... G09G 3/32 345/76
2008/0252565 A1* 10/2008 Jeon ......................... G09G 3/22 345/74.1

(Continued)

FOREIGN PATENT DOCUMENTS

CN 1932951 3/2007
EP 0838800 4/1998

*Primary Examiner* — Hong Zhou
(74) *Attorney, Agent, or Firm* — Jaffery Watson Mendonsa & Hamilton LLP

(57) ABSTRACT

Systems and apparatuses provide a digital architecture with merged non-linear emission clocks for a display panel. In one embodiment, a display driver hardware circuit includes decoder logic to store a mapping between a plurality of non-linear gray scale clock signals and a merged non-linear gray scale clock signal that represents a combination of the plurality of non-linear gray scale clock signals including first and second non-linear gray scale clock signals. In one example, the first non-linear gray scale clock signal is associated with at least one display element of a first color and the second non-linear gray scale clock signal is associated with at least one display element of a second color. A driver circuitry is coupled to the decoder logic. The driver circuitry includes a counter to store a number of pulses of the merged non-linear gray scale clock signal and driving circuitry to cause emission of the at least one display element of a first color based on the first non-linear gray scale clock signal.

26 Claims, 23 Drawing Sheets

(56) References Cited

U.S. PATENT DOCUMENTS

| | | | | |
|---|---|---|---|---|
| 2009/0085845 | A1* | 4/2009 | Cho | G09G 3/2014 345/83 |
| 2012/0327128 | A1* | 12/2012 | Li | G09G 3/32 345/690 |
| 2014/0168037 | A1 | 6/2014 | Sakariya et al. | |
| 2015/0339998 | A1 | 11/2015 | Yen | |
| 2018/0182279 | A1 | 6/2018 | Sakariya et al. | |
| 2018/0211582 | A1 | 7/2018 | Sakariya et al. | |

* cited by examiner

900

912 914 916

| Counter | Red | Blue |
|---|---|---|
| 1 | R1 | |
| 2 | R2 | |
| 3 | R3 | |
| 4 | R4 | |
| 5 | R5 | |
| 6 | R6 | |
| 7 | | B1 |
| 8 | R7 | |
| 9 | R8 | |
| 10 | R9 | |
| 11 | | B2 |
| 12 | R10 | |
| 13 | | B3 |
| 14 | R11 | |
| 15 | R12 | |
| • • • | • • • | • • • |
| | | |
| | R255 | |
| | | |
| 509 | | B252 |
| 510 | | B253 |
| 511 | | B254 |
| 512 | | B255 |

FIG. 9

1100

1112 1114 1116 1118

| Counter | Red | Blue | Green |
|---|---|---|---|
| 1 | R1 | | |
| 2 | R2 | | |
| 3 | R3 | | |
| 4 | R4 | | |
| 5 | R5 | | G1 |
| 6 | R6 | | |
| 7 | | B1 | |
| 8 | R7 | | |
| 9 | R8 | | |
| 10 | R9 | | |
| 11 | | | G2 |
| 12 | | B2 | |
| 13 | R10 | | |
| 14 | | | G3 |
| 15 | | B3 | |
| 16 | R11 | | |
| | | | |
| | | | |
| | | | |
| | R255 | | |
| | | | |
| 509 | | B252 | |
| 510 | | B253 | |
| 511 | | B254 | |
| 512 | | B255 | |

FIG. 11

FIG. 15
TO µDRIVERS
1530
ROW DRIVER
1500
FROM PREVIOUS
ROW DRIVER
1502
N
EM_BASE 1510
RESET
ROW_CONFIG_EN
DATA_BASE_CLK
SCAN_SCLK
SCAN_PCLK
S_PCLK
EM_BASE 1520
N
TO NEXT ROW
DRIVER
1504
S_PCLK
SCAN_PCLK
SCAN_SCLK
DATA_BASE_CLK
ROW_CONFIG_EN
ROW_RESET

DIGITAL ARCHITECTURE WITH MERGED NON-LINEAR EMISSION CLOCK SIGNALS FOR A DISPLAY PANEL

RELATED APPLICATIONS

This application claims the benefit of priority of U.S. Provisional Application No. 62/233,250 filed Sep. 25, 2015, which is incorporated herein by reference.

BACKGROUND

Field

The disclosure relates generally to a display system, and, more specifically, to a digital architecture with merged non-linear emission clock signals for a display panel.

Background Information

Display panels are utilized in a wide range of electronic devices. Common types of display panels include active matrix display panels where each pixel may be driven to display a data frame. High-resolution color display panels, such as computer displays, smart phones, and televisions, may use an active matrix display structure. An active matrix display of m×n display (e.g., pixel) elements may be addressed with m row lines and n column lines or a subset thereof. In conventional active matrix display technologies a switching device and storage device is located at every display element of the display. A display element may be a light emitting diode (LED) or other light emitting material. A storage device(s) (e.g., a capacitor or a data register) may be connected to each display (e.g., pixel) element, for example, to load a data signal therein (e.g., corresponding to the emission to be emitted from that display element). The switches in conventional displays are usually implemented through transistors made of deposited thin films, and thus are called thin film transistors (TFTs). A common semiconductor used for TFT integration is amorphous silicon (a-Si), which allows for large-area fabrication in a low temperature process. A main difference between a-Si TFT and a conventional silicon metal-oxide-semiconductor-field-effect-transistor (MOSFET) is lower electron mobility in a-Si due to the presence of electron traps. Another difference includes a larger threshold voltage shift. Low temperature polysilicon (LTPS) represents an alternative material that is used for TFT integration. LTPS TFTs have a higher mobility that a-Si TFTs, yet mobility is still lower than for MOSFETs.

SUMMARY

Systems and apparatuses provide a digital architecture with merged non-linear emission clocks for a display panel. In one embodiment, a display driver hardware circuit includes decoder logic to store a mapping between a plurality of non-linear gray scale clock signals and a merged non-linear gray scale clock signal that represents a combination of the plurality of non-linear gray scale clock signals including first and second non-linear gray scale clock signals. In one example, the first non-linear gray scale clock signal is associated with at least one display element of a first color and the second non-linear gray scale clock signal is associated with at least one display element of a second color. A driver circuitry is coupled to the decoder logic. The driver circuitry includes a counter to store a number of pulses of the merged non-linear gray scale clock signal and driving circuitry to cause emission of the at least one display element of a first color based on the first non-linear gray scale clock signal.

In one example, the first and second non-linear gray scale clock signals are each represented with a first number of bits and the merged non-linear gray scale clock signal is be represented with a second number of bits.

In one embodiment, the driver circuitry further includes a data register to store a modified data signal having a first set of data and a second set of data. A comparator is coupled to the data register. The comparator compares the modified data signal from the data register to a number of pulses of the merged non-linear clock signal. In response to output of the comparator, the driving circuitry to cause the emission of the at least one display element of a first color and to cause an emission of the at least one display element of a second color.

In one embodiment, the plurality of non-linear gray scale clock signals further includes a third non-linear gray scale clock signal that is associated with a display element of a third color. The merged clock signal further includes pulses of the third non-linear gray scale clock signal.

In one example, adjacent display elements are multiple rows and multiple columns of a display panel.

In one embodiment, a micro-driver hardware circuit includes a counter to receive a merged non-linear gray scale clock signal that represents a combination of a plurality of non-linear gray scale clock signals including first and second non-linear gray scale clock signals with each of the first and second clock signals being associated with a different color of display elements. The counter stores a number of pulses of the merged non-linear gray scale clock signal. A driving circuitry is coupled to the counter. The driving circuitry causes emissions of the display elements based on the merged non-linear gray scale clock signal.

In one example, the first and second non-linear gray scale clock signals are each represented with a first number of bits and the merged non-linear gray scale clock signal is represented with a second number of bits.

In one embodiment, the micro-driver hardware circuit further includes a data register to store a modified data signal having at least a first set of data that is associated with the first non-linear gray scale clock signal and a second set of data that is associated with the second non-linear gray scale clock signal. A comparator is coupled to the data register. The comparator compares the modified data signal from the data register to a number of pulses of the merged non-linear clock signal. In response to output of the comparator, the driving circuitry causes an emission of at least one display element of a first color based on the first set of data and causes an emission of at least one display element of a second color based on the second set of data.

In one example, the plurality of non-linear gray scale clock signals further includes a third non-linear gray scale clock signal that is associated with a display element of a third color. The merged clock signal further includes pulses of the third non-linear gray scale clock signal.

In one embodiment, a method to drive a display panel includes counting a number of pulses of a merged non-linear gray scale clock that represents a combination of a plurality of non-linear gray scale clock signals including first and second non-linear gray scale clock signals with each of the first and second clock signals being associated with a different color of display elements. The method further includes modifying a data signal that is represented with a first number of bits into a modified data signal that is represented with a second number of bits in order to identify a first set of data and a second set of data of the data signal.

The method further includes storing the modified data signal having the first set of data that is associated with the first non-linear gray scale clock signal and storing the second set of data that is associated with the second non-linear gray scale clock signal in a data register. The method further includes comparing the modified data signal from the data register to a number of pulses of the merged non-linear clock signal.

The method further includes causing an emission of at least one display element of a first color based on the first set of data and causing an emission of at least one display element of a second color based on the second set of data.

In one example, the first and second non-linear gray scale clock signals are each represented with a first number of bits and the merged non-linear gray scale clock signal is represented with a second number of bits.

In another example, the plurality of non-linear gray scale clock signals further include a third non-linear gray scale clock signal that is associated with a display element of a third color.

In one embodiment, a display system includes row selection logic to select a number of rows in an emission group of a display panel. The display system also includes decoder logic to store a mapping between a plurality of non-linear gray scale clock signals and a merged non-linear gray scale clock signal that represents a combination of the plurality of non-linear gray scale clock signals including first and second non-linear gray scale clock signals. In one example, each of the first and second clock signals are associated with a different color of display elements. The display system also includes driver circuitry that is coupled to the decoder logic. The driver circuitry includes a counter to store a number of pulses of the merged non-linear gray scale clock signal and driving circuitry to cause emissions of the display elements based on the merged non-linear gray scale clock signal.

In one example, the first and second non-linear gray scale clock signals are each represented with a first number of bits and the merged non-linear gray scale clock signal is represented with a second number of bits.

In one embodiment, the driver circuitry further includes a data register to store a modified data signal having a first set of data and a second set of data. A comparator is coupled to the data register. The comparator compares the modified data signal from the data register to a number of pulses of the merged non-linear clock signal. In response to an output of the comparator, a driving circuitry of the driver circuitry causes an emission of at least one display element of a first color and causes an emission of at least one display element of a second color.

In one example, the plurality of non-linear gray scale clock signals further includes a third non-linear gray scale clock signal that is associated with a display element of a third color.

In one embodiment, the row selection logic receives the merged non-linear gray scale clock signal and sends the merged non-linear gray scale clock signal to the driver circuitry.

In one embodiment, a driver circuitry includes logic to receive a merged non-linear clock signal. The logic is designed for separating or extracting a plurality of non-linear clocks signals including first and second non-linear clock signals that have been merged into the merged non-linear clock signal. A counter is coupled to the logic. The counter receives the first non-linear clock signal or a clock signal that is based on the first non-linear clock signal. The counter stores a number of pulses of the first non-linear gray scale clock signal or the clock signal that is based on the first non-linear clock signal. A comparator is coupled to the counter. The comparator compares a data signal to a number of pulses of the first non-linear clock signal or the clock signal that is based on the first non-linear clock signal. Driving circuitry is coupled to the counter. The driving circuitry, in response to output of the comparator, causes emissions of at least one display element of a first color that is associated with the first non-linear clock signal.

In one example, the logic includes a delay cell to delay the merged clock signal and to generate a delayed clock signal. The logic includes a logic function to be applied to the merged clock signal and the delayed clock signal. The logic function generates the second non-linear clock signal or a clock signal that is based on the second non-linear clock signal. The second non-linear clock signal is associated with at least one display element of a second color.

In another example, the plurality of non-linear gray scale clock signals further includes a third non-linear gray scale clock signal that is associated with a display element of a third color.

BRIEF DESCRIPTION OF THE DRAWINGS

Embodiments are illustrated by way of example and not limitation in the Figures of the accompanying drawings:

FIG. 9 is a diagram of a LUT for mapping individual non-linear gray scale clock signals (e.g., 8 bit red signal, 8 bit blue signal, 8 bit green signal) into a data domain (e.g., 9 bit domain, 10 bit domain) in accordance with one embodiment.

FIG. 11 is a diagram of a LUT for mapping individual non-linear gray scale clock signals (e.g., 8 bit red signal, 8 bit blue signal, 8 bit green signal) into a data domain (e.g., 10 bit domain) in accordance with one embodiment.

DETAILED DESCRIPTION

Figure 1:
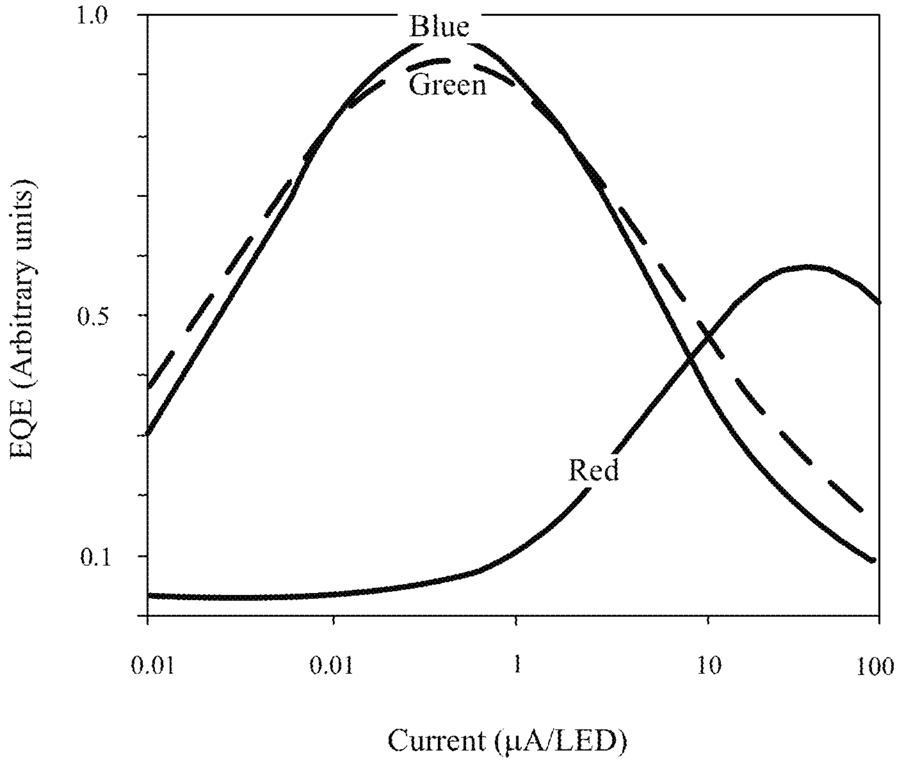
FIG. 1 is a graphical illustration of the relationship of external quantum efficiency (EQE) to operating current for a semiconductor-based micro LED in accordance with an embodiment.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known techniques and components have not been described in particular detail in order to not unnecessarily obscure the present disclosure. Reference throughout this specification to "one embodiment," "an embodiment", or the like means that a particular feature, structure, configuration, or characteristic described in connection with the embodiment is included in at least one embodiment of the disclosure. Thus, the appearances of the phrase "in one embodiment," "in an embodiment", or the like in various places throughout this specification are not necessarily referring to the same embodiment of the disclosure. Furthermore, the particular features, structures, configurations, or characteristics may be combined in any suitable manner in one or more embodiments.

Systems and apparatuses provide a digital architecture with merged non-linear emission clocks for a display panel. In one embodiment, non-linear emission clock signals (e.g., red, green, blue) for emitting display elements are merged into a single emission clock signal. Decoding functionality stores a mapping between individual non-linear emission clock signals and a merged emission clock signal in order to reduce a number of emission clocks signals and pins needed for routing the emission clocking signals to the row drivers and micro-drivers of a display panel having display elements. In one example, a merged emission clock signal reduces a number of clock signals and pins or pads by a factor of 3 throughout a display panel.

In accordance with some embodiments, a display panel is described including an arrangement of micro-driver (also referred to as μD or μDriver) chips and micro LEDs (also referred to as μLEDs). Additionally, methods, systems, and apparatuses for controlling an emission of a display panel (e.g., its display elements) are discussed herein. In particular, methods, systems, and apparatuses are described for emission control, including grey scale control, that are particularly applicable to a display panel including an arrangement of micro-driver chips and micro LEDs.

In an embodiment, a micro LED may be a semiconductor-based material having a maximum lateral dimension of 1 to 300 μm, 1 to 100 μm, 1 to 20 μm, or more specifically 1 to 10 μm, such as 5 μm. For example, a micro-driver chip may have a maximum lateral dimension of 1 to 300 μm, and may fit within the pixel layout of the micro LEDs. In accordance with embodiments, the micro-driver chips can replace the switch(s) and storage device(s) for each display element as commonly employed in a TFT architecture. The micro-driver chips may include digital unit cells, analog unit cells, or hybrid digital and analog unit cells. Additionally, MOSFET processing techniques may be used for fabrication of the micro-driver chips on single crystalline silicon as opposed to TFT processing techniques on a-Si or LTPS. In accordance with other embodiments the micro-drivers may represent logic/circuits formed within the display substrate, for example, within a monocrystalline silicon substrate, rather than surface mounted chips.

In one aspect, significant efficiencies may be realized over TFT integration techniques. For example, micro-driver chips may utilize less real estate of a display substrate than TFT technology. For example, micro-driver chips incorporating a digital unit cell can use a digital storage element (e.g. register) which consumes comparatively less area that an analog storage capacitor. Where the micro-driver chips include analog components, MOSFET processing techniques on single crystalline silicon can replace thin film techniques that form larger devices with lower efficiency on a-Si or LTPS. Micro-driver chips may additionally require less power than TFTs formed using a-Si or LTPS. In other embodiments, the micro-driver logic/circuits may be formed within the display substrate, for example, within a monocrystalline silicon substrate using MOSET processing techniques that may provide efficiencies compared to TFT integration.

In another aspect, a micro LED display element may be utilized, e.g., such that the power consumed by the micro LED is a minor portion of the total power consumption of the display device, for example, from a battery. In such an aspect, micro LEDs may be highly efficient at light emission and consume significantly (e.g., orders of magnitude) less power at emission compared to other display elements such as organic light emitting diodes (OLED) and liquid crystal display (LCD). FIG. 1 is a graphical illustration of the relationship of external quantum efficiency (EQE) to operating current for a semiconductor-based micro LED in accordance with an embodiment. Embodiments are not limited to the exemplary EQE curves and operating currents illustrated in FIG. 1, though the illustration shows some relationships that may be applicable to one or more embodiments. For example, micro LEDs designed for different color emission may have different characteristic efficiencies. In the particular embodiment illustrated, the blue and green emitting micro LEDs have more similar characteristic EQE curves than the red emitting micro LED. Efficiencies may depend upon a variety of factors, including materials selection, fabrication methods, size, shape, etc. Additionally, maximum efficiency ranges occur at different operating currents and current densities for different micro LEDs. In the embodiment illustrated in FIG. 1, blue and green emitting micro LEDs may have a characteristic maximum efficiency range between 0.1 and 20 μA, while red emitting micro LEDs may have a characteristic maximum efficiency range between 10 and 200 μA. Furthermore, the current ranges illustrated in exemplary FIG. 1 may be relatively high compared to OLED or LCD.

In another aspect, embodiments describe a digital display architecture in which short pulses can be supplied from a constant current source, and at specified levels on the EQE curves for the color-specific LEDs. For example, emission pulses widths can be as low as 10 ns without being sensitive to micro LED pulse slew rates (e.g., there will be two edges for all grey levels). The minimum pulse width, e.g. 10 ns, may be much smaller than a line time, e.g. 40 μs. The number of rows in an emission group may be adjustable from a single row to the full panel. The number of pulses per frame may be adjustable from, e.g., 1 to 10. The emission pulse length may be adjustable from continuous (100% duty cycle) to 10 ns. The control column may specify which pixel emits within a row, and the number of column may be adjustable from a single column to the full panel. In some embodiments, multiple emission pulses may be supplied with each data frame. In certain embodiments, grey levels are achieved by pulse width modulation (PWM) of the emission pulse to the display elements. In some embodiments including multiple emission pulses may per data frame, one or more pulse widths may be modified to achieve a specified grey level.

Figure 2:
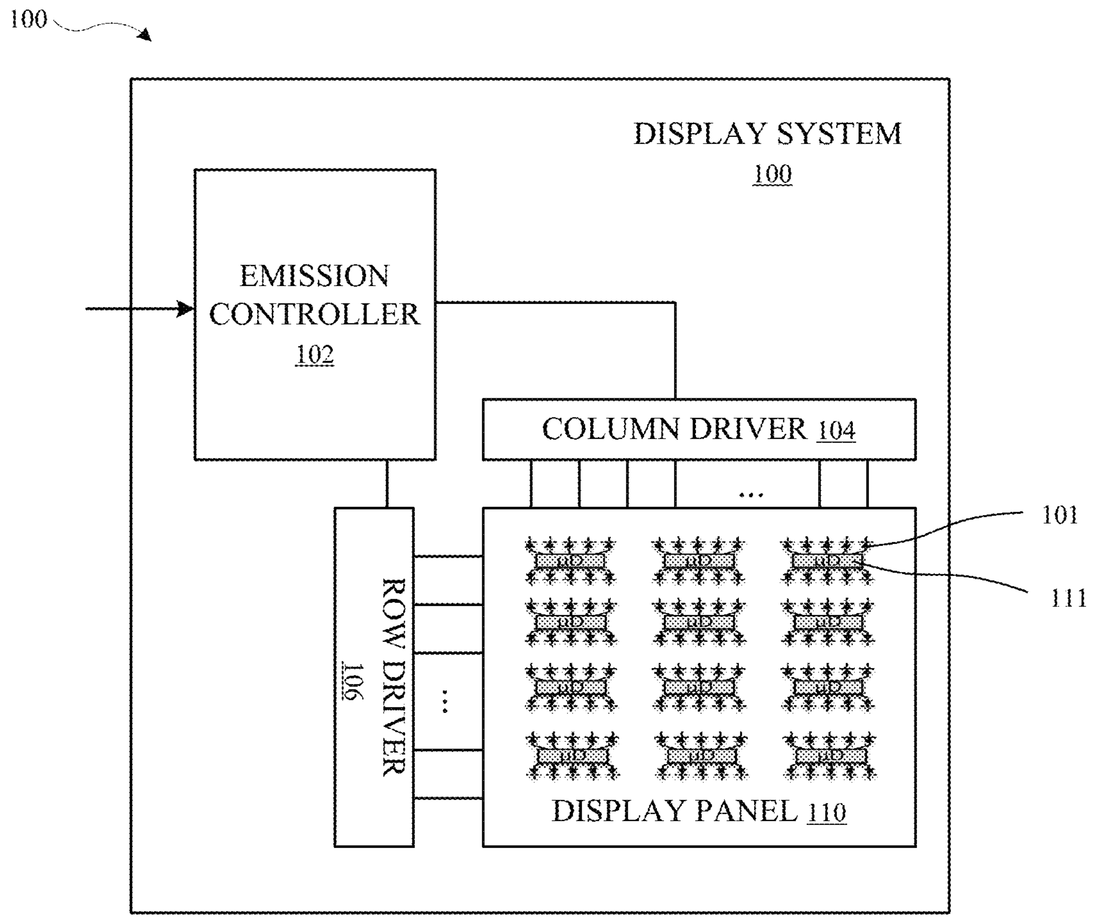
FIG. 2 is a display system according to one embodiment of the disclosure.

FIG. 2 is a display system 100 according to one embodiment of the disclosure. Emission controller 102 may receive as an input the content to be displayed on (e.g., all or part of) a display panel 110, e.g., an input signal corresponding to the picture information (e.g., a data frame). Emission controller may include a circuit (e.g., logic) to selectively cause a display element to emit (e.g., visible to a human eye) light. An emission controller may cause a storage device(s) (e.g., a capacitor or a data register) for (e.g., operating) a display element (e.g., of the plurality of display elements) to receive a data signal (e.g., a signal to turn a display element off or on). A column driver 104 and/or row driver 106 may be a component of the emission controller. A column driver 104 may allow the emission controller 102 to communicate with (e.g., control) a column of display elements. A row driver 106 may allow the emission controller 102 to communicate with (e.g., control) a row of display elements. A column driver 104 and a row driver 106 may allow an emission controller 102 to communicate with (e.g., control) an individual display element or a group of display elements (e.g., a pixel or subpixel).

Display panel 110 may include a matrix of pixels. Each pixel may include multiple subpixels that emit different colors of lights. In a red-green-blue (RGB) subpixel arrangement, each pixel may include three subpixels that emit red light, green light, and blue light, respectively. It is to be appreciated that the RGB arrangement is exemplary and that this disclosure is not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels. In an embodiment, one or more display elements (e.g., LED 101) may connect to a micro-driver (e.g., μD 111) that drives (e.g., according to the emission controller 102) the emission of light from the one or more display elements. For example, the micro-drivers 111 and display elements 101 may be surface mounted on the display panel 110. Although the depicted micro-drivers include ten display elements, the disclosure is not so limited and a micro-driver may drive one display element or any plurality of display elements. In an embodiment, display element (e.g., 101) may be a pixel, for example, with each pixel including three display element subpixels (e.g., a red, green, and blue LED).

In one embodiment, a display driver hardware circuit (e.g., a hardware emission controller) may include one or more of: (e.g., row selection) logic to select a number of rows in an emission group of a display panel, in which the number of rows is adjustable from a single row to a full panel of the display panel, (e.g., column selection) logic to select a number of columns in the emission group of the display panel, in which the number of columns is adjustable from a single column to the full panel of the display panel, and (e.g., emission) logic to select a number of pulses per data frame to be displayed, in which the number of pulses per data frame is adjustable from one to a plurality and a pulse length is adjustable from a continuous duty cycle to a non-continuous duty cycle. An emission controller may include hardware, software, firmware, or any combination thereof. In one embodiment, an emission controller causes a display refresh of 60 Hz to 240 Hz with four pulses of a display element (e.g., LED) per video frame.

Figure 3A:
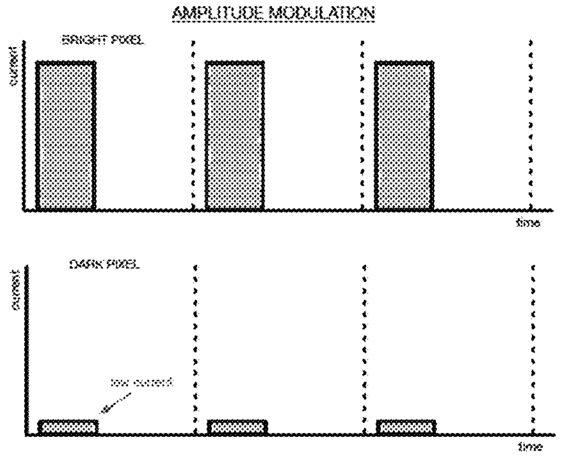
FIG. 3A is an illustration of amplitude modulation (AM) in which the current level per pixel sets the grey level according to one embodiment of the disclosure.
Figure 3B:
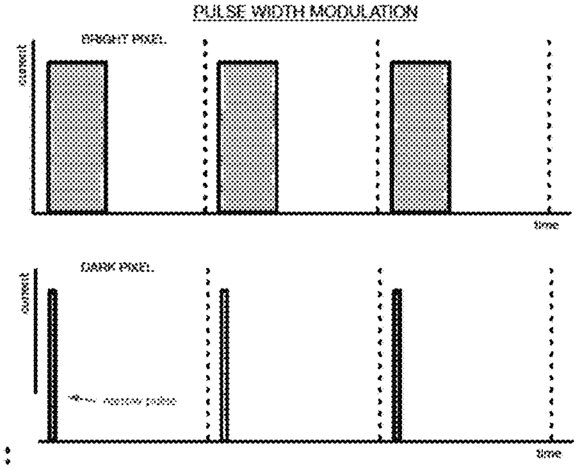
FIG. 3B is an illustration of pulse width modulation (PWM) in which the pulse width sets the grey level according to one embodiment of the disclosure.
Figure 3C:
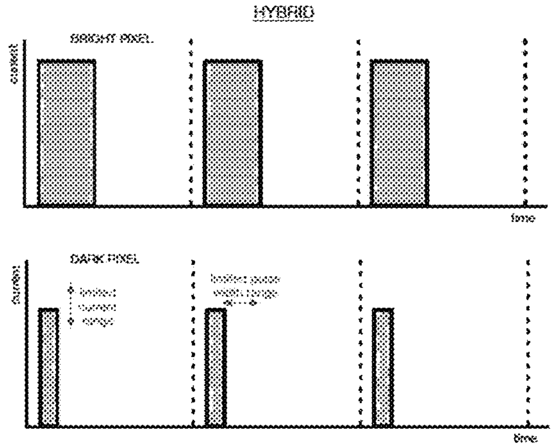
FIG. 3C is an illustration of a hybrid modulation in which pulse width may be modulated to set a coarse grey level, and current level is modulated to set a fine grey level according to one embodiment of the disclosure.

FIGS. 3A-3C are generic illustrations for various manners for controlling emission pulses to a display element for controlling grey scale, or perceived brightness as viewed by the human eye, in accordance with embodiments. FIG. 3A is an illustration of amplitude modulation (AM) in which the current level per pixel sets the grey level, in accordance with an embodiment. As illustrated, a higher current level corresponds to a higher brightness, with lower current level corresponding to a lower brightness, or dark pixel. In an embodiment, global pulse width or length can be set at a constant where amplitude modulation is used to set the grey level. Referring briefly back to FIG. 1, in an embodiment utilizing AM, a variable current range may be selected at a specific current range corresponding to a specified EQE range of the LED.

FIG. 3B is an illustration of pulse width modulation (PWM), also referred to as pulse length modulation, in which the pulse width or length sets the grey level, in accordance with an embodiment. As illustrated, a higher pulse width or length corresponds to a higher brightness, with a narrower pulse corresponding to a lower brightness, or dark pixel. In an embodiment, global current can be set at a constant where PWM is used to set the grey level. Referring briefly back to FIG. 1, in an embodiment utilizing PWM, a constant current level may be selected at a specific current corresponding to a specified EQE of the LED.

In accordance with embodiments utilizing AM, LEDs are driven in a range of current levels. Where LED performance drift occurs during the lifetime of the LED, the LEDs may potentially behave differently at low current levels later in life, or the EQE may not be optimal (e.g., lower on the EQE curve) at the lower current levels. In accordance with embodiments utilizing PWM, LEDs are driven with a range of pulse widths, which may potentially require very small pulse widths to produce the lowest grey levels. FIG. 3C is an illustration of a hybrid modulation in accordance with an embodiment in which pulse width may be modulated to set a coarse grey level, and current level is modulated to set a fine grey level. As illustrated, a higher current level and pulse width corresponds to a higher brightness, with a lower current level and narrower pulse corresponding to a lower brightness, or dark pixel. In an embodiment, hybrid modulation is employed for high dynamic displays, which can require dynamic ranges up to $10^6$, where deficiencies in relying solely on AM or PWM may be apparent.

Figure 4:
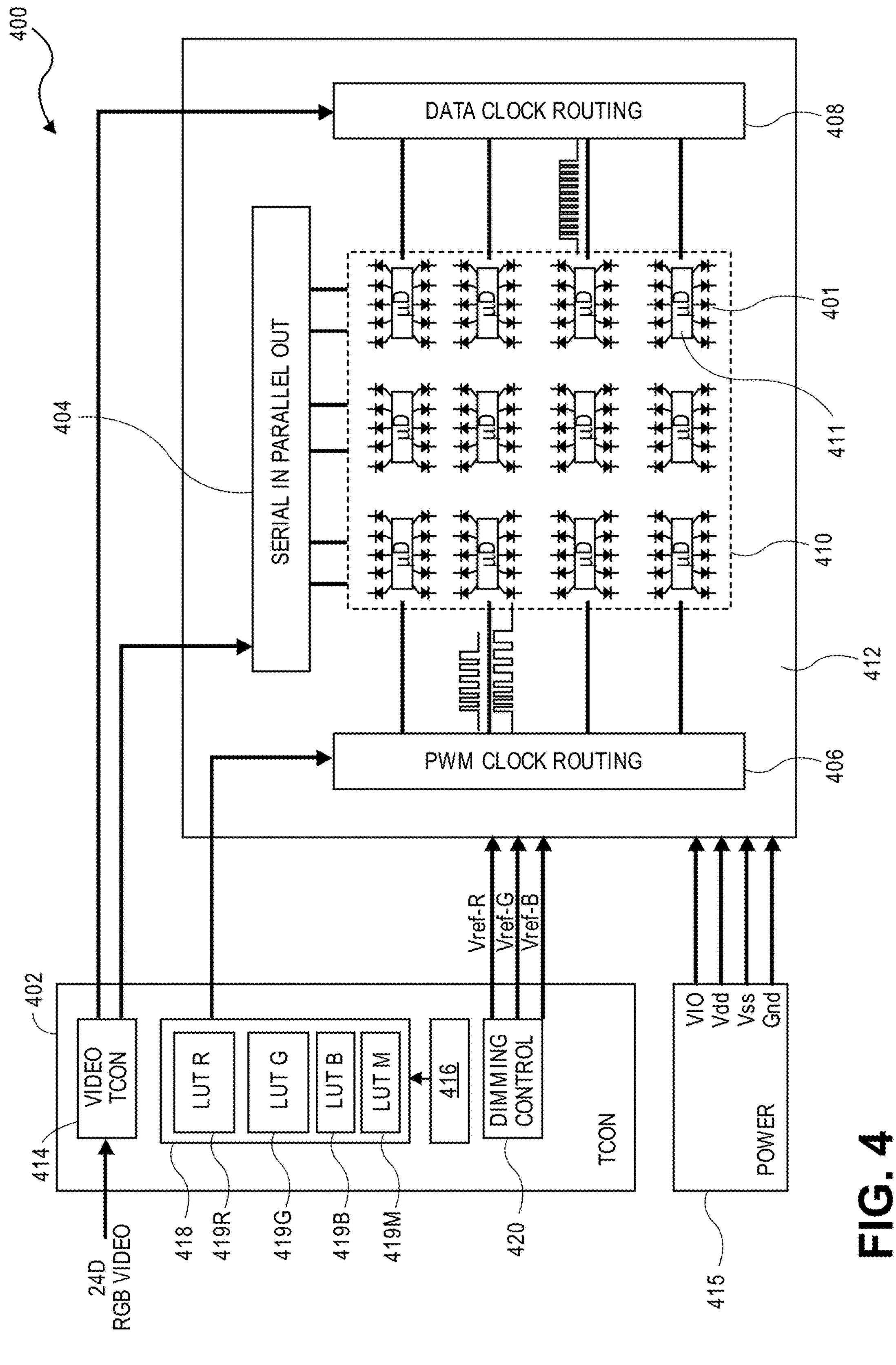
FIG. 4 is a display system with multiple micro-drivers (μD) according to one embodiment of the disclosure.

FIG. 4 is a display system 400 with multiple micro-drivers (μD) according to one embodiment of the disclosure. Emission controller 402 may be a field-programmable gate array (FGPA) integrated circuit. Depicted emission controller 402 includes a video timing controller 414, e.g., to provide timing control signals to the display backplane 412, non-linear clock generator 418 which may be controlled by an emission timing controller 416, and a dimming controller 420. Depicted non-linear clock generator 418 includes a plurality of look-up tables (LUT), e.g., a red (R) light emitting element LUT 419R, a green (G) LUT 419G, a blue (B) LUT 419B, etc., to provide non-linear clock signals for the red, green, and blue light emitting elements. Each pulse from a non-linear clock generator may have the same amplitude (e.g., height) but be of varying widths (e.g., as a function of the amount of the time the pulse is active (e.g., logic 1 value, goes high)). Each color of light emitting element (e.g., red, green, and blue) may have its own non-linear clock signal. Additional LUTs for red, green, and blue light emitting elements may also be included for different types of lighting conditions (e.g., lower lighting level, intermediate lighting level, higher lighting level) of a display panel.

In one example, each non-linear clock signal for a particular color may include multiple phases (e.g., 4, 8, 16, etc.) of clock signals generated by the clock generator in order to minimize or reduce current resistance (IR) drops on digital voltage rails and also reduce display artifacts at group boundaries for rows that are grouped together. However, a larger number of phases of clock signals causes more challenging routing of the clock signals to row drivers of row selection logic and also routing of clock signals to the micro-drivers.

In one embodiment, a plurality of the non-linear clock signals (e.g., red, green, blue) are merged into a single clock signal. A merged LUT M 419M stores a mapping between individual non-linear clock signals and a merged clock signal in order to reduce a number of clocks signals and pins needed for routing the clocking signals to the row drivers and micro-drivers of a display panel. In one example, a merged clock signal reduces a number of clock signals and pins or pads by a factor of 3.

Power module 415 may power the components of display system 400. Emission controller 402 may receive an input of data (e.g., signals) that contains the display (e.g., pixel) data and provide the data (e.g., signals) to cause the display elements (e.g., LEDs) of the active area to emit light according to the display data via the micro-drivers in active area 410. Depicted backplane 412 includes a non-linear pulse width modulation (PWM) clock routing circuit 406, e.g., to route the clock signals to the active area 410. Depicted backplane 412 includes a serial in parallel out circuit 404, e.g., to route the video signals to the active (e.g., display) area 410. Depicted backplane 412 includes a data clock routing (e.g., scan control) circuit 408, e.g., to route the display data signals to the active area 410. Data clock routing (e.g., scan control) circuit 408 may utilize a linear clock signal, e.g., to gate the display data signals into its circuitry. This clock signal may be provided by the video timing controller 414. One or more display elements (e.g., LED 501) may connect to a micro-driver (e.g., μD 411) that drives (e.g., according to the emission controller 402) the emission of light from the one or more display elements. Although the depicted micro-drivers include ten display elements, the disclosure is not so limited and a micro-driver may drive one display element or any plurality of display elements. Display element (e.g., 401) may be a pixel, for example, with each pixel including three display element subpixels (e.g., a red, green, and blue LED).

A signal from a gray scale clock may be a series of (e.g., non-linear) pulses, for example, of varying duration of time but at the same amplitude. Gray scale clock may allow gray scale control in the time domain. Each single pulse of a gray scale clock may non-linearly correspond to different gray scale levels, e.g., such that each emission pulse becomes progressively longer for higher gray levels. An exemplary 8 bit counter value generates 256 gray levels and an exemplary 9 bit counter value generates 512 gray levels although a counter of a micro-driver may be any size (e.g., with corresponding gray levels). In one embodiment, different widths of pulses correspond to the same gray scale levels for respective (e.g., different colored) display elements.

Figure 5:
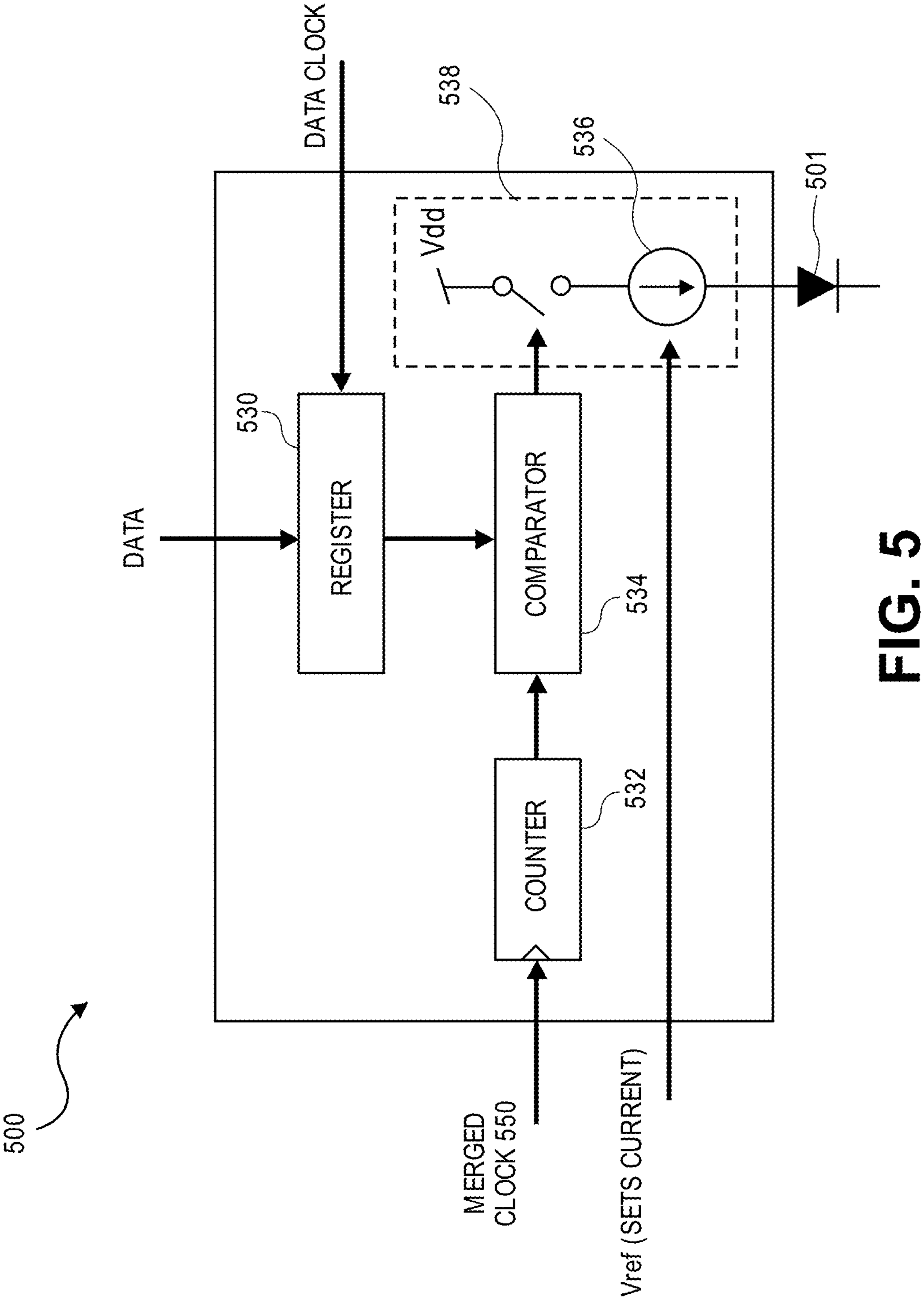
FIG. 5 is a unit cell of a micro-driver according to one embodiment of the disclosure.
Figure 6:
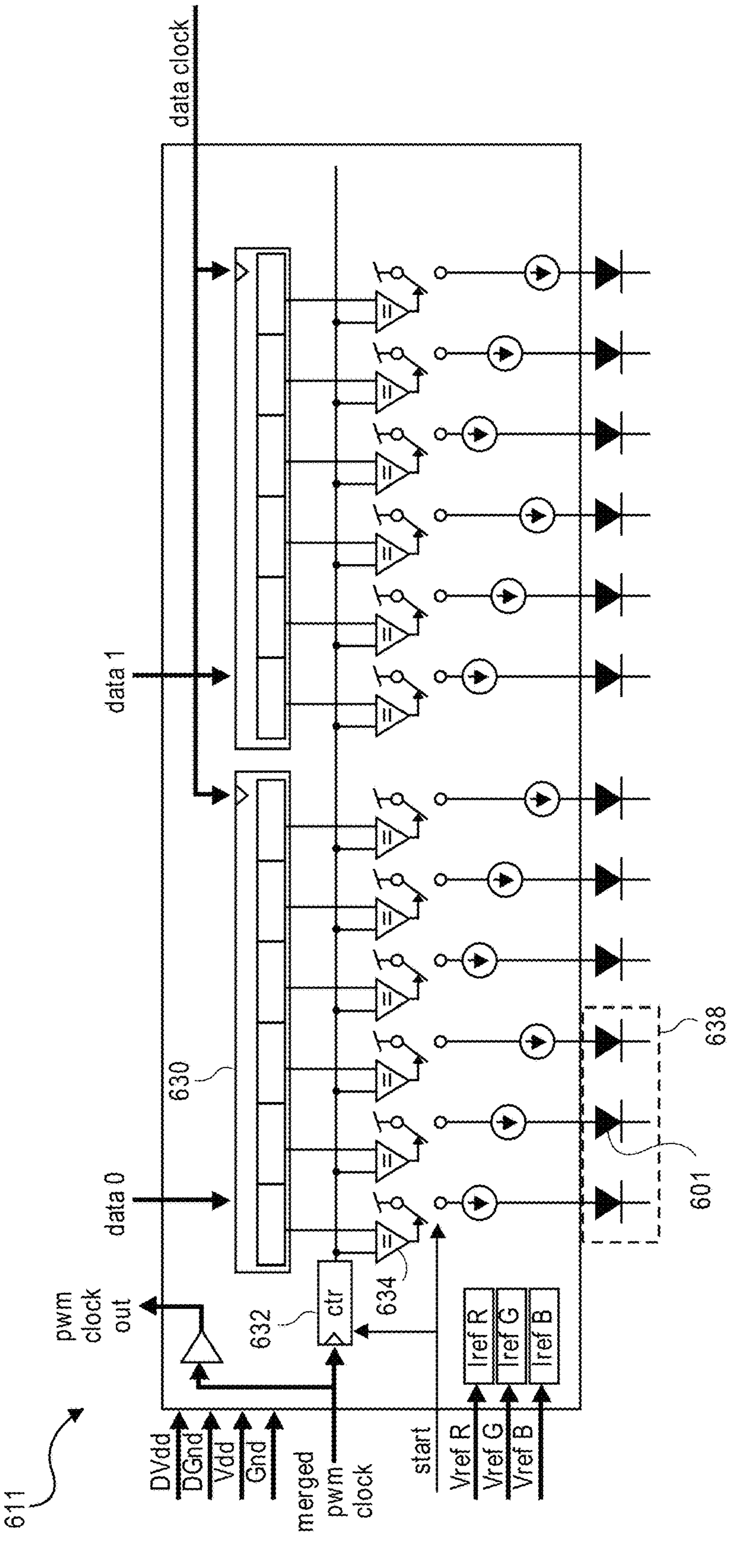
FIG. 6 is a micro-driver according to one embodiment of the disclosure.

In the embodiments illustrated and described thus far with reference to FIGS. 4-6, gamma correction is performed by the non-linear clock generator(s) on the emission controller 402 rather than at each micro driver. Accordingly, video data can be stored uncorrected on the micro-drivers. Performing gamma correction with the non-linear clock generator(s) may help minimize the micro-driver chip size, facilitating higher density pixels per inch in the active area, since circuit size and complexity is not necessary for higher bit logic. Power reduction may additionally be realized, with less data clock cycles for loading data, and less grey level clock transitions.

FIG. 5 is a unit cell 500 of a micro-driver according to one embodiment of the disclosure. FIG. 6 is a micro-driver 611 according to one embodiment of the disclosure. In the following discussion, micro-driver 611 may be any of the micro-drivers described herein. Micro driver 611 may include one or more unit cells (e.g., 500). A micro-driver may include one or more components of unit cells (e.g., 600). Depicted unit cell 500 includes a register 530 (e.g., digital data storage device) to store a data signal corresponding to the emission to be output from the display element (e.g., LED 501). Data stored in a register may be referred to as digital data, e.g., in contrast to analog data stored in a capacitor. Data (e.g., video) signal may be loaded (e.g., stored) into the register by any method, for example, by being clocked in according to a data clock. In one embodiment, the data clock signal being active (e.g., logic level 1, goes high) allows data to enter the register and then the data is latched into the register when the data clock signal is inactive (e.g., logic level 0, goes low). A merged non-linear gray scale clock signal 550 that represents a plurality of non-linear clock signals (e.g., red, green, blue) may increment a counter 532. The gray scale clock signal 550 may also reset the counter to its original value (e.g., zero).

Unit cell 500 also includes a comparator 534. Comparator may compare a data signal from the register 530 to a number of pulses from a (e.g., non-linear) gray scale clock counted by counter 532 to cause an emission by display element (e.g., LED 501), e.g., when the data signal (e.g., modified, adjusted or manipulated data signal) differs from (e.g., or is greater or less than) the number of pulses from the merged non-linear gray scale clock signal. The data signal is modified, adjusted or manipulated to correspond to appropriate pulses of the merged clock signal. A LUT (e.g., merged LUT) performs decoding functionality for decoding of the merged clock signal. Depicted comparator may cause a switch of driving circuitry 538 to activate a current source 536 to cause the display element (e.g., LED 501) to illuminate accordingly. A current source (e.g., adjusted via an input, such as, but not limited to a reference voltage (Vref) may provide current to operate a display element (e.g., μLED) at its optimum current, e.g., for efficiency as described with regard to FIG. 1. A current source may have its current set by a control signal, such as a bias voltage setting the current, use of a (e.g., Vth) compensation pixel circuit, or adjusting a resistor of a constant current operational amplifier (op amp) to control the output of the op amp's current.

FIG. 6 is a micro-driver 611 according to one embodiment of the disclosure. Micro-driver 611 may be utilized as a micro-driver in a display system. Micro-driver 611 includes multiples of certain components of a unit cell 500. Although a single counter 532 is depicted, each display element or each group of (e.g., same or similar colored) display elements may have its own counter (e.g., and its own non-linear PWM clock). Other components may function in accordance with the description of FIG. 5. Emission controller may provide the (e.g., input) signals in FIG. 6. Display data (e.g., data 0 and data 1 in FIG. 6) may be provided by emission controller, e.g., as sourced from video or other visual content. Each current source for a display element(s) or a group of (e.g., same or similar colored) display elements may receive a control signal (e.g., from emission controller) for outputting a constant current when enabled. The current of a current source may be set during manufacture (e.g., once) or it may be dynamically adjustable (e.g., during use of the display system). Each pixel (e.g., 638) may have its own micro-driver. Register 630 may be a vector register, e.g., such that each element of vector stores the data signal for its particular display element. Comparator 634 may compare a data signal from the register 630 to a number of pulses from the merged (e.g., non-linear) gray scale clock signal counted by counter 632 to cause an emission by display element (e.g., LED 601), e.g., when the data signal differs from (e.g., or is greater or less than) the number of pulses from the merged non-linear gray scale clock. Depicted comparator may cause a switch to activate a current source to cause the display element (e.g., LED 601) to illuminate accordingly. The display data is modified, adjusted or manipulated to correspond to appropriate pulses of the merged clock signal. A LUT (e.g., merged LUT 419M) performs decoding functionality for decoding of the merged clock signal.

Figure 7:
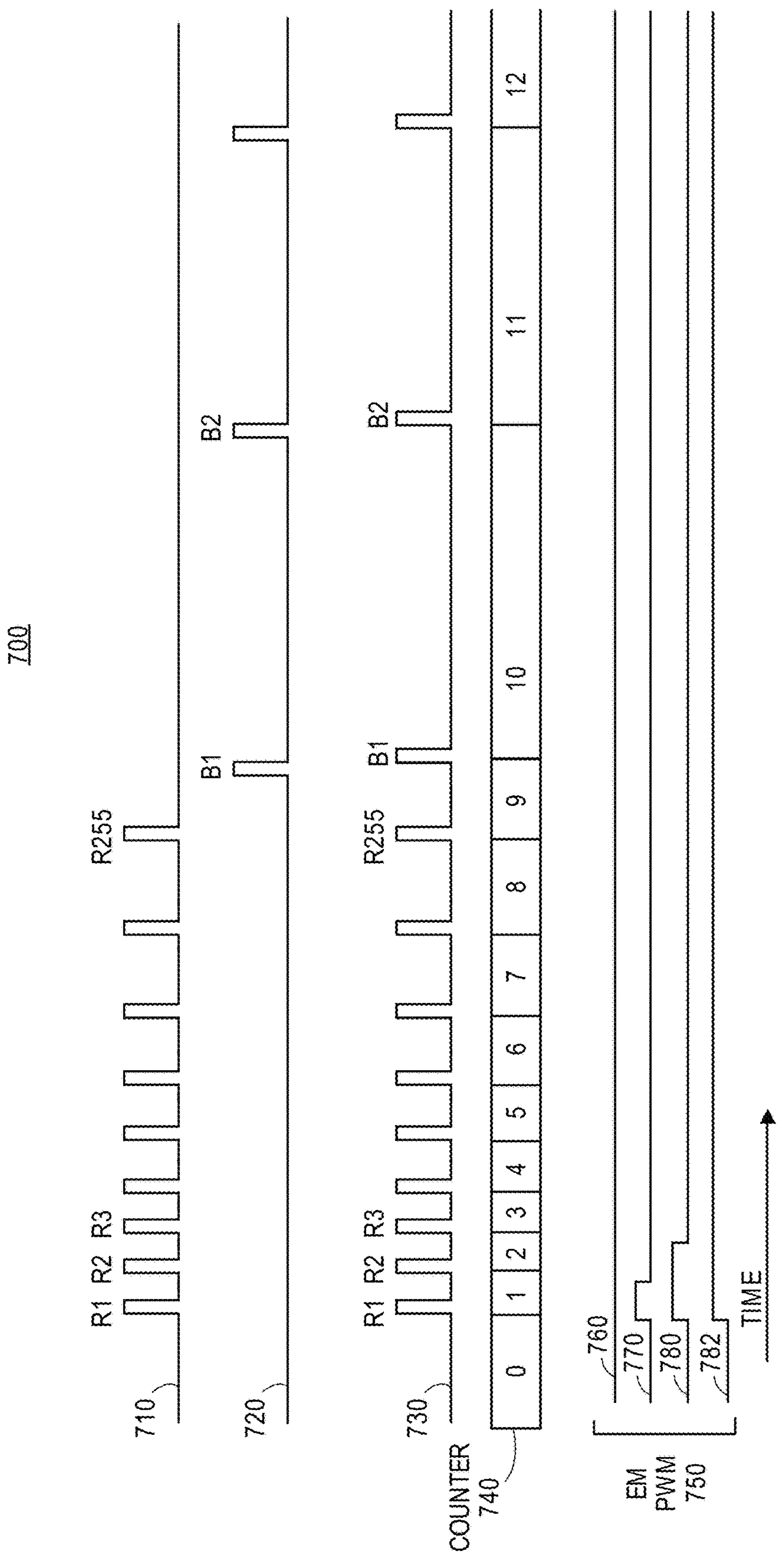
FIG. 7 is an emission pulse width modulation (PWM) control timing diagram according to one embodiment of the disclosure.

FIG. 7 is an emission pulse width modulation (PWM) control timing diagram according to one embodiment of the disclosure. Each micro-driver (or unit cell or grouping of unit cells of a microdriver) may utilize a single gray level (e.g., emission (EM)) counter for a single merged clock signal. Alternatively, each micro-driver may include a counter for each color of a pixel array. In one example, a clock signal 710 for causing emission of red display elements is merged with a clock signal 720 for causing emission of blue display elements to generate a merged clock signal 730. The clock signal 710 includes different pulses including pulses R1, R2, R3, and R255. Each pulse corresponds to a different gray scale level. For example, the pulse R1 corresponds to a gray scale level 1 for a red display element. The clock signal 720 includes different pulses including pulses B1 and B2. Each pulse corresponds to a different gray scale level. For example, the pulse B1 corresponds to a gray scale level 1 for a blue display element. The merged clock signal 730 includes the pulses of the signals 710 and 720. In this example, the merged clock signal 730 includes 512 rising edges for capturing the clock signals 710 and 720.

The EM counter of a unit cell of a micro-driver may be toggled by the merged clock signal 730 and reset by a reset clock signal. For a merged clock signal, there may be an emission PWM control block (e.g., a comparator) to compare the EM counter value with the stored (e.g., pixel) data to turn on the display element (e.g., μLED) emission for a specified number of EM_CLK periods. In one embodiment, the EM counter may count (e.g., from 0 to 512 for 9 bits for a merged clock signal having 2 individual clock signals, 0 to 768 for 10 bits for a merged clock signal having 3 individual clock signals) in increments of one and causes a corresponding emission PWM signals 760, 770, 780, and 782, for example, as shown in FIG. 7. The signal 760 represents a pixel value of 0, the signal 770 represents a pixel value of 1, the signal 780 represents a pixel value of 2, and the signal 782 represents a pixel value of 255.

In the example of FIG. 7, no timing overlap exists between the red and blue pulses of the clock signals 710 and 720. Decoding of a merged clock signal 730 is simple due to the lack of timing overlap in which initial edges of the clock signal correspond to red pulses and later edges of the clock signal correspond to blue pulses. In other examples, a timing overlap does exist between individual clock signals of a merged clock signal. For these examples, decoding functionality (e.g., merged LUT 419M, other decoding functionality) is needed for determining whether a pulse of the merged clock signal corresponds to at least two of a first clock signal (e.g., red), a second clock signal (e.g., blue), or a third clock signal (e.g., green) to be merged into the merged clock signal. In this example, a merged LUT maps two individual non-linear gray scale clock signals (e.g., 8 bit red signal, 8 bit blue signal, 8 bit green signal) into a 9 bit data domain. In another example, a merged LUT maps three individual non-linear gray scale clock signals (e.g., 8 bit red signal, 8 bit blue signal, 8 bit green signal) into a 10 bit data domain. A micro-driver receives the data signals (e.g., 9 bit domain, 10 bit domain) and uses the data signals to build individual non-merged emission pulses (e.g., red pulses, blue pulses, green pulses).

Figure 8:
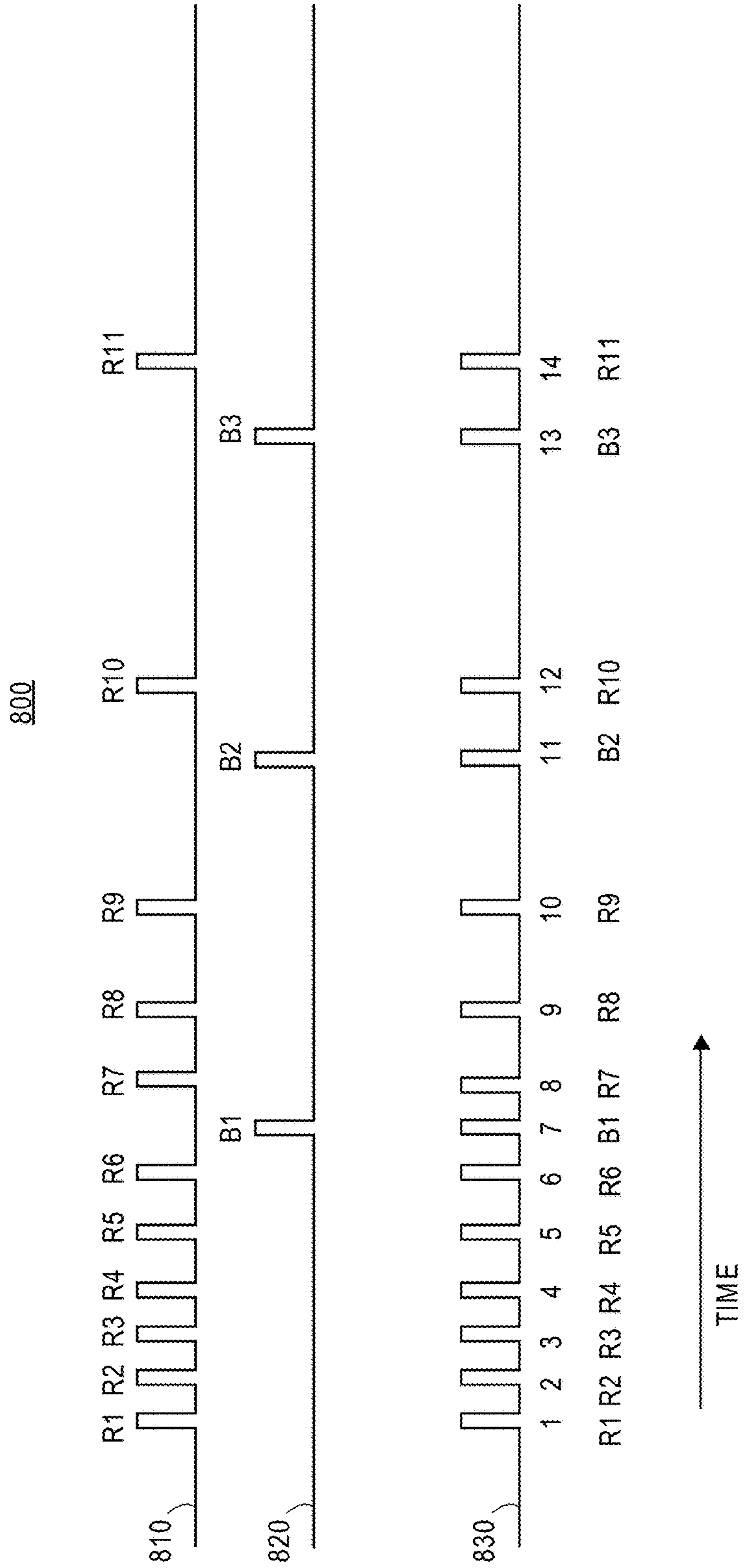
FIG. 8 is an emission pulse width modulation (PWM) control timing diagram according to one embodiment of the disclosure.

FIG. 8 is an emission pulse width modulation (PWM) control timing diagram according to one embodiment of the disclosure. Each (e.g., unit cell or other grouping of a) micro-driver may utilize a single gray level (e.g., emission (EM)) counter for a single merged clock signal. Alternatively, each micro-driver may include a counter for each color of a pixel array. In one example, a clock signal 810 for causing emission of red display elements is merged with a clock signal 820 for causing emission of blue display elements to generate a merged clock signal 830. The clock signal 810 includes different pulses including pulses R1-R11. Each pulse corresponds to a different gray scale level. For example, the pulse R1 corresponds to a gray scale level 1 for a red display element. The clock signal 820 includes different pulses including pulses B1-B3. Each pulse corresponds to a different gray scale level. For example, the pulse B1 corresponds to a gray scale level 1 for a blue display element. The merged clock signal 830 includes the pulses of the signals 810 and 820. In this example, the merged clock signal 830 includes 512 rising edges for capturing the clock signals 810 and 820.

FIG. 9 is a diagram of a LUT for mapping individual non-linear gray scale clock signals (e.g., 8 bit red signal, 8 bit blue signal, 8 bit green signal) into a data domain (e.g., 9 bit data, 10 bit domain) in accordance with one embodiment. The LUT 900 (e.g., merged LUT) includes counter data 912, a first non-linear clock signal data 914 (e.g., red clock signal data), and a second non-linear clock signal data 916 (e.g., blue clock signal data). In this example, a merged LUT 900 maps two individual non-linear gray scale clock signals (e.g., 8 bit red signal, 8 bit blue signal) into a 9 bit data domain. A micro-driver receives the adjusted or manipulated data signals (e.g., 9 bit domain, 10 bit domain) and uses the data signals to build individual non-merged emission pulses (e.g., red pulses, blue pulses, green pulses) for emitting display elements.

Figure 10:
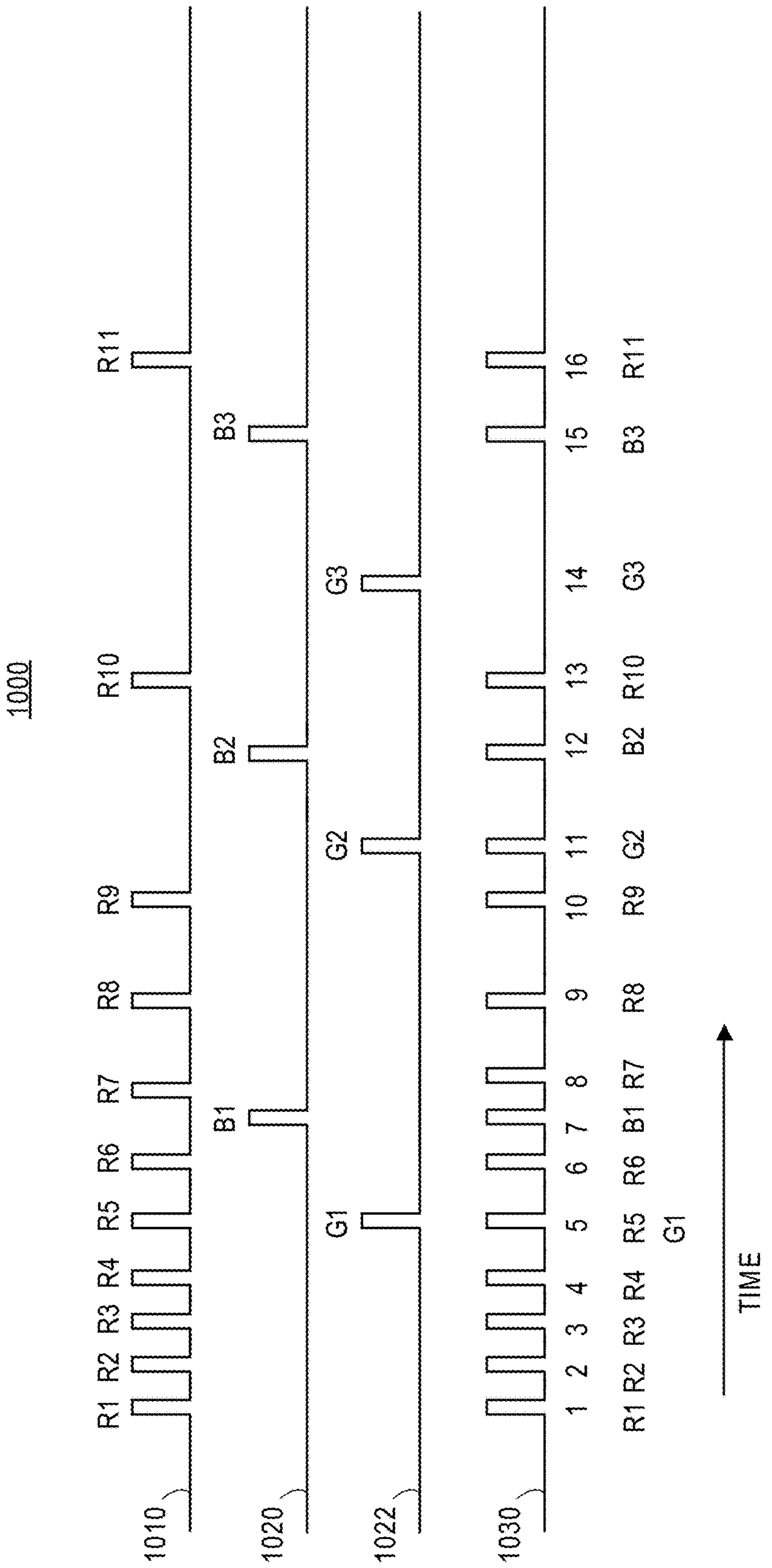
FIG. 10 is an emission pulse width modulation (PWM) control timing diagram according to one embodiment of the disclosure.

FIG. 10 is an emission pulse width modulation (PWM) control timing diagram according to one embodiment of the disclosure. Each (e.g., unit cell or other grouping of a) micro-driver may utilize a single gray level (e.g., emission (EM)) counter for a single merged clock signal. Alternatively, each micro-driver may include a counter for each color of a pixel array. In one example, a clock signal 1010 for causing emission of red display elements is merged with a clock signal 1020 for causing emission of blue display elements and also a clock signal 1022 for causing emission of green display elements to generate a merged clock signal 1030. The clock signal 1010 includes different pulses including pulses R1-R11. Each pulse corresponds to a different gray scale level. For example, the pulse R1 corresponds to a gray scale level 1 for a red display element. The clock signal 1020 includes different pulses including pulses B1-B3. Each pulse corresponds to a different gray scale level. For example, the pulse B1 corresponds to a gray scale level 1 for a blue display element. The clock signal 1022 includes different pulses including pulses G1-G3. The merged clock signal 1030 includes the pulses of the signals 1010, 1020, and 1022. In this example, the merged clock signal 1030 includes 768 rising edges for capturing the clock signals 1010, 1020, and 1030.

FIG. 11 is a diagram of a LUT for mapping individual non-linear gray scale clock signals (e.g., 8 bit red signal, 8 bit blue signal, 8 bit green signal) into a data domain (e.g., 10 bit domain) in accordance with one embodiment. The LUT 1100 (e.g., merged LUT) includes counter data 1112, a first non-linear clock signal data 1114 (e.g., red clock signal data), a second non-linear clock signal data 1116 (e.g., blue clock signal data), and a third non-linear clock signal data 1118 (e.g., green clock signal data). In this example, a merged LUT 1100 maps three individual non-linear gray scale clock signals (e.g., 8 bit red signal, 8 bit blue signal, 8 bit green signal) into a 10 bit data domain. A micro-driver receives the modified, adjusted or manipulated data signals (e.g., 10 bit domain) and uses the data signals to build individual non-merged emission pulses (e.g., red pulses, blue pulses, green pulses) for emitting display elements.

Figure 12:
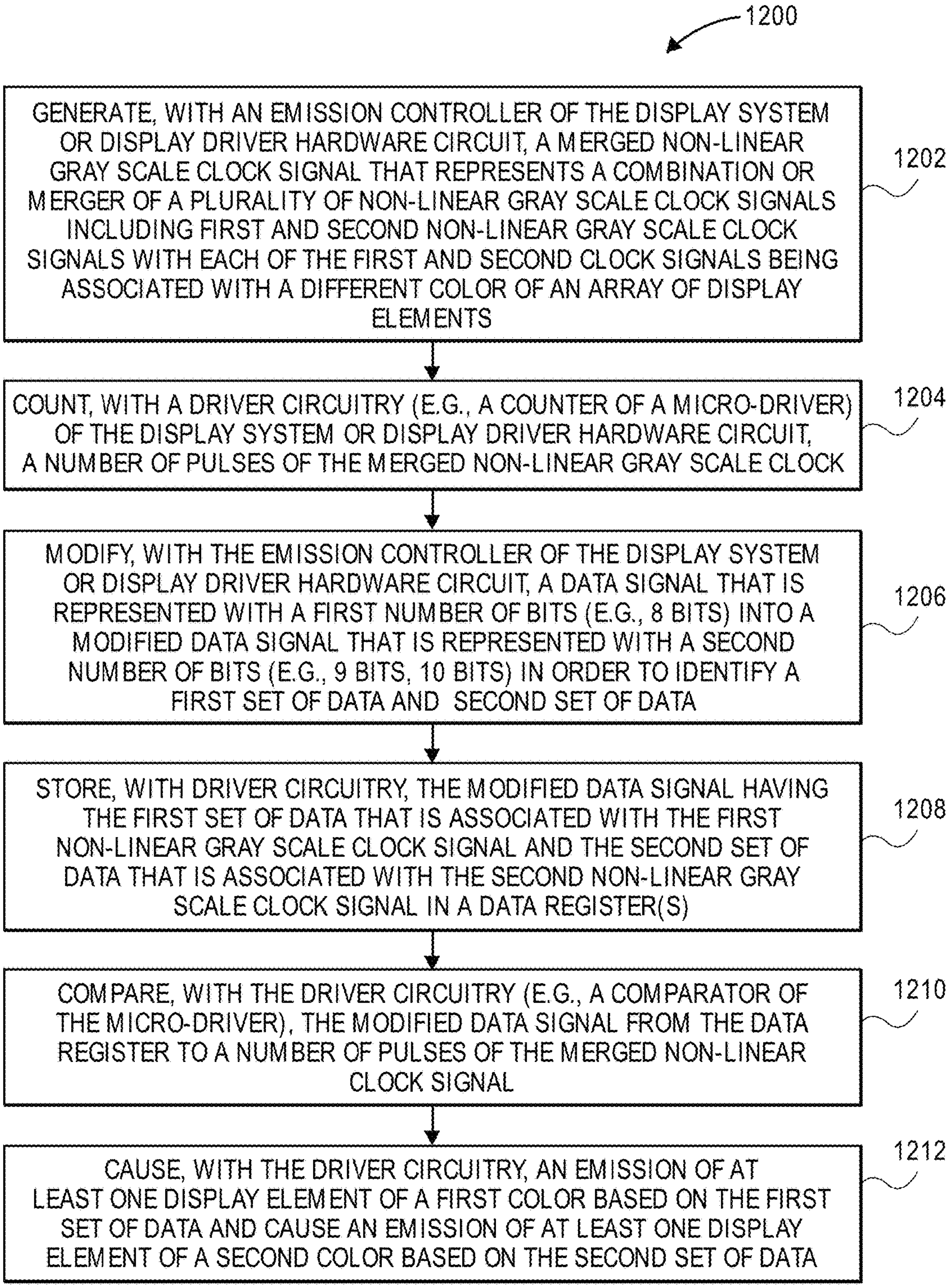
FIG. 12 is a flow diagram of operations of a method 1200 for driving a display panel using a merged emission clock signal according to one embodiment.

FIG. 12 is a flow diagram of operations of a method 1200 for driving a display panel using a merged emission clock signal according to one embodiment. The operational flow of method 1200 may be executed by an apparatus or system or electronic device, which includes processing circuitry or processing logic. The processing logic may include hardware (circuitry, dedicated logic, etc.), software (such as is run on a general purpose computer system or a dedicated machine or a device), or a combination of both. In one embodiment, a display system, display driver hardware circuit, or processing logic of the display system or display driver hardware circuit performs the operations of method 1200.

At operation 1202, an emission controller of the display system or display driver hardware circuit generates a merged non-linear gray scale clock signal that represents a combination or merger of a plurality of non-linear gray scale clock signals including first and second non-linear gray scale clock signals with each of the first and second clock signals being associated with a different color of an array of display elements. In one example, the first and second non-linear gray scale clock signals are each represented with a first number of bits (e.g., 8 bits) and the merged non-linear gray scale clock signal is represented with a second number of bits (e.g., 9 bits, 10 bits).

At operation 1204, a driver circuitry (e.g., a counter of a micro-driver) of the display system or display driver hardware circuit counts a number of pulses of the merged non-linear gray scale clock signal. At operation 1206, the emission controller of the display system or display driver hardware circuit modifies a data signal that is represented with a first number of bits (e.g., 8 bits) into a modified data signal that is represented with a second number of bits (e.g., 9 bits, 10 bits) in order to identify a first set of data and a second set of data. At operation 1208, the driver circuitry stores the modified data signal having the first set of data that is associated with the first non-linear gray scale clock signal and the second set of data that is associated with the second non-linear gray scale clock signal in a data register(s).

At operation 1210, the driver circuitry (e.g., a comparator of the micro-driver) compares the modified data signal from the data register to a number of pulses of the merged non-linear clock signal. The modified data signal (e.g., for the data to be displayed) may be stored in a register and compared with a comparator against the number of pulses stored in the counter to cause an output of light if a difference occurs between the modified data signal and the number of pulses. The output of light continues until the comparator indicates the emission count value has reached the value indicated by the modified data signal. At operation 1212, the driver circuitry causes an emission of at least one display element of a first color based on the first set of data and causing an emission of at least one display element of a second color based on the second set of data.

In one example, the merged clock signal further includes pulses of a third non-linear gray scale clock signal. The merged clock signal may also include additional pulses of clock signals.

Figure 13:
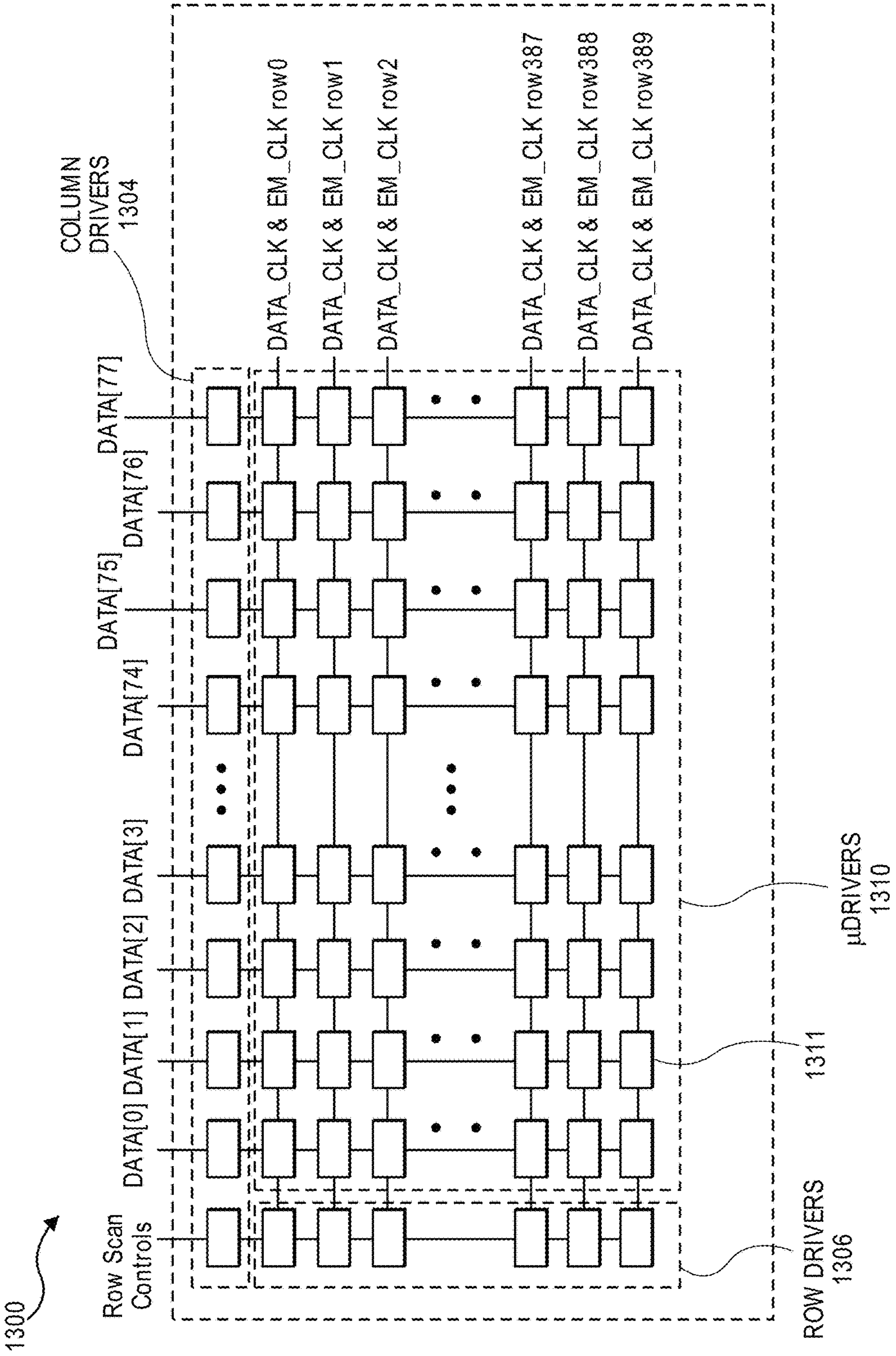
FIG. 13 is a block diagram of a display system according to one embodiment of the disclosure.

Referring now to FIG. 13, a block diagram is provided of a display system 1300 according to one embodiment of the disclosure. Active (e.g., display) area 1310 includes multiple micro-drivers (e.g., micro-driver 1311 as an example). A micro-driver may selectively illuminate its corresponding display element(s) (e.g., LED(s)). Display system 1300 may (e.g., via an emission controller, not shown) include column driver(s) 1304 and/or row driver(s) 1306. Column drivers 1304 may include individual drivers for each column. Row drivers 1306 may include individual drivers for each row. In one embodiment, column driver(s): provide electrostatic discharge (ESD) protection for the interface signals, e.g., that are exposed to the external world, provide buffering for the incoming data (e.g., DATA[column number]) and row scan controls (e.g., data clock and emission (gray scale) clock); provide emission column selection signals to turn on and off a column or columns selectively; and/or perform analog muxing for emission current read-out. Each column driver may control one micro-driver column (e.g., which may be equivalent to four display element (e.g. pixel) columns).

In one embodiment, row driver(s) (e.g., placed along the left or right edge of the active area 1310): provide ESD protection for row routings during display element (e.g., LED) transfer process; for example, based on incoming row scan controls, generate a data clock signal (e.g., DATA_CLK) for each display row, e.g., which may be used as the latching clock of incoming data (e.g., DATA) in each micro-driver; and/or for example, based on incoming row scan controls, generate gray scale clock signal (e.g., EM_CLK) for each display row, e.g., which may be used for emission control in each micro-driver. In an embodiment, each row driver may control one display element (e.g. pixel) row.

In one embodiment, micro-driver(s): latch the (e.g., pixel) values on the data (e.g., DATA) routing, for example, coming from column drivers); and/or use the data clock signal (e.g., DATA_CLK, which may come from the row drivers) to count the number of emission (e.g., gray scale) clock pulses (e.g., EM_CLK cycles) up to the received pixel value for each subpixel, for example, to control each display element's (e.g., LED's) luminance as a function of gray code (e.g., by a PWM method).

Figure 14:
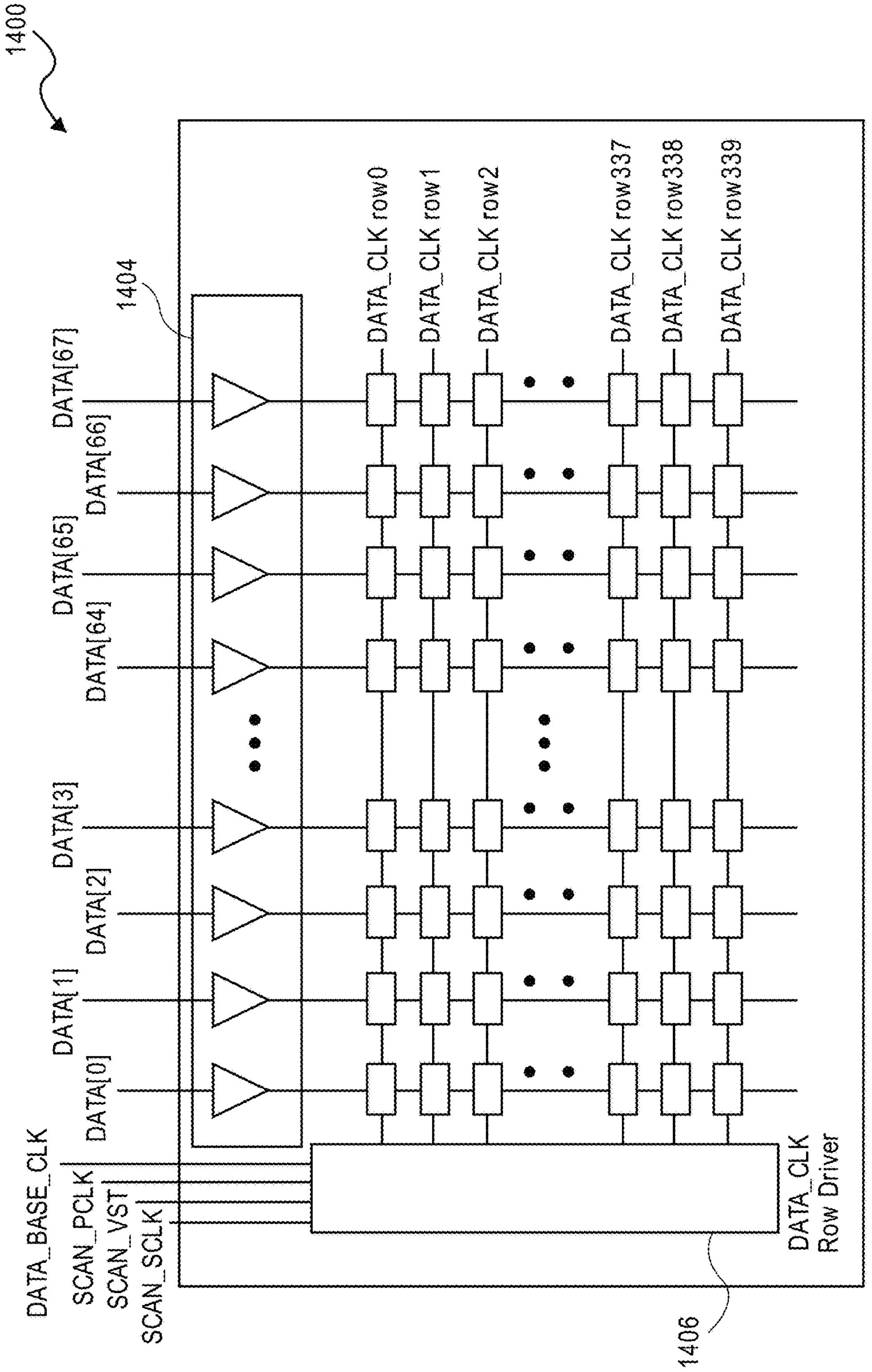
FIG. 14 is a diagram of pixel data distribution according to one embodiment of the disclosure.

FIG. 14 is a diagram of pixel data distribution 1400 according to one embodiment of the disclosure. Data scan may be based on the raster scan by using the vertical DATA signals (e.g., generated by the emission controller and/or buffered by the column drivers 1404) and the horizontal DATA_CLK signals (e.g., generated by the row drivers 1406 using the scan control signals from the emission controller). Data (e.g., DATA) signals may contain the (e.g., pixel) data signals for the micro-drivers (e.g., generated by the emission controller and/or buffered by column drivers). Each column driver may provide data for one column of micro-drivers, which may correspond to multiple (e.g., 4) columns of display elements (e.g., pixels). Row drivers 1406 may generate the DATA_CLK for each display row, and each micro-driver may use the incoming DATA_CLK to latch the incoming DATA from the column drivers 1404. Row drivers together may form a shift register to generate the DATA_CLKs. In one example, the DATA_CLK shift register may include a 1st stage shift register, a 2nd stage latch, and a 3rd stage clock gating array. The 1st stage may be controlled by SCAN_SCLK signal (e.g., from row scan shift register clock) and SCAN_VST signal (e.g., row scan start). SCAN_PCLK signal (e.g., from row scan latch clock) may be used to load the contents of the 1st stage to the 2nd stage latch.

Figure 15:
FIG. 15 is a block diagram of a row driver in accordance with one embodiment.
Figure 16A:
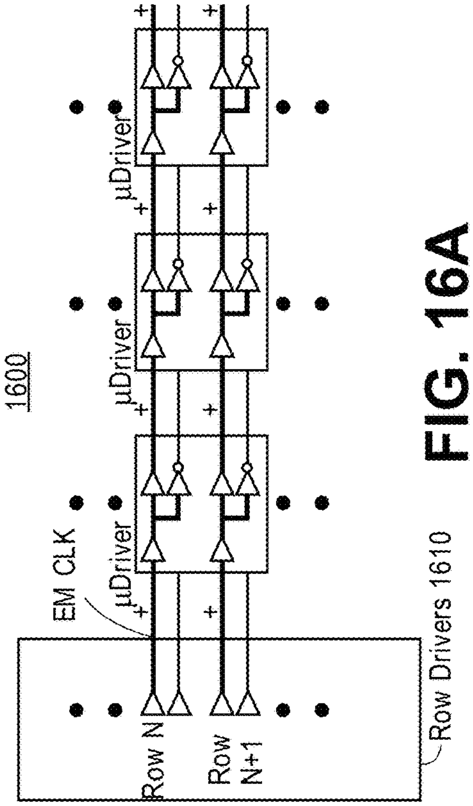
FIG. 16A-16D are clock polarity options according to one embodiment of the disclosure.
Figure 16B:
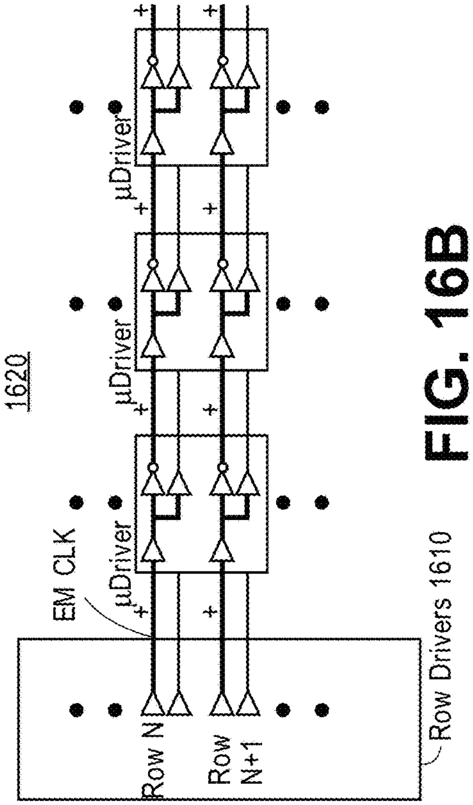
Figure 16C:
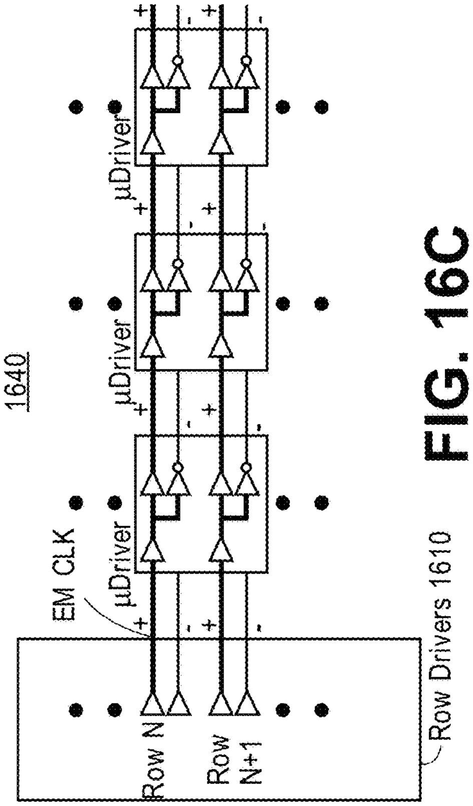
Figure 16D:
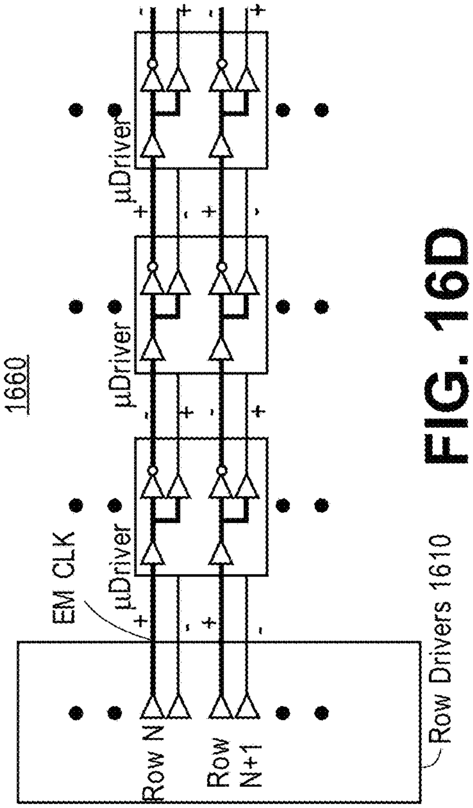

FIG. 15 is a block diagram of a row driver in accordance with one embodiment. The row driver 1500 receives row scan controls such as row reset, row configure enable, data base clock, scan sclk, scan pclk, and emission row start latch clock signals from an emission controller. The row driver 1500 receives inputs (e.g., emission base clock signals 1510, emission base reset signals, and other signals) from a previous row driver 1502. The row driver 1500 sends outputs (e.g., emission base clock signals 1520, emission base reset signals, other signals) to a next row driver 1504. The row driver 1500 also sends outputs (e.g., emission clock signals, emission control reset signals, data clock signals) to an adjacent row of micro-drivers 1530.

In one example, the row driver 1500 receives N emission base clock signals from a previous row driver 1502 and sends N emission base clock signals to a next row driver 1504. N is an integer value that depends on a number of clock phases and a number of display elements being driven. For an emission base clock signal having 4 phases that has not been merged in accordance with embodiments of the present disclosure, the row driver receives 12 emission base clock signals (N=12) that includes 4 phases of red emission clock signals for red display elements, 4 phases of blue emission clock signals for blue display elements, and 4 phases of green emission clock signal for green display elements. N also equals 12 for the emission base clock output signals 1520.

For an emission base clock signal having 8 phases that has not been merged in accordance with embodiments of the present disclosure, the row driver receives 24 emission base clock signals (N=24) that includes 8 phases of red emission clock signals for red display elements, 8 phases of blue emission clock signals for blue display elements, and 8 phases of green emission clock signal for green display elements. N also equals 24 for the emission base clock output signals 1520.

For an emission base clock signal having 16 phases that has not been merged in accordance with embodiments of the present disclosure, the row driver receives 48 emission base clock signals (N=48) that includes 16 phases of red emission clock signals for red display elements, 16 phases of blue emission clock signals for blue display elements, and 16 phases of green emission clock signal for green display elements. N also equals 48 for the emission base clock output signals 1520.

In one embodiment, an emission controller generates a merged clock signal to reduce routing of a number of clock signals and pins for the row drivers and micro-drivers. For display panels with red, green, and blue display elements, the number of clock signals and pins can be reduced by a factor of 3 using the merged clock signal that merges red, green, and blue emission clock signals.

In one example, for an emission base clock signal having 8 phases that has been merged in accordance with embodiments of the present disclosure, the row driver receives 8 merged emission base clock signals (N=8) that includes 8 phases of merged clock signals (e.g., merged with red, blue, and green clock signals). N also equals 8 for the emission base clock output signals 1520.

In another example, for an emission base clock signal having 16 phases that has been merged in accordance with embodiments of the present disclosure, the row driver receives 16 merged emission base clock signals (N=16) that includes 16 phases of merged clock signals (e.g., merged with red, blue, and green clock signals). N also equals 16 for the emission base clock output signals 1520.

The present design includes merging emission clock signals that reduce emission clock distribution over an entire display panel. This significantly reduces routing, buffering, and multiplexing logic. The present design includes driver circuitry (e.g., micro-driver) with reduced power consumption, reduced active area, and reduced pin counts due to the merged emission clock signals. Additionally, routing and pin counts for the back plane and row drivers is also reduced. Embodiments of merging clock signals have been discussed in terms of using a rising clock edge for clocking implementations. A double clock edge can also be utilized in order to reduce clock frequency by a factor of 2 to further reduce power consumption of emission clocking.

Each row driver (e.g., row driver 1500) selects one phase of a clock signal. In one example, rows of micro-drivers that receive the emission clock signal from a row driver can be grouped by a phase of a clock signal. A first group of rows is assigned a first clock phase, a second group is assigned a second clock phase, etc.

FIGS. 16A-16D illustrate single-ended and differential modes of column driving for individual column drivers according to one embodiment of the disclosure. Additionally or alternatively, this may be utilized for individual row drivers (see, e.g., FIG. 13) in a single-ended or a differential mode. In one embodiment, each micro-driver shall have the option of inverting the incoming EM_CLK (e.g., via OUT-_POL_SWAP_EN signal to activate an inverter (NOT gate) to invert the incoming EM_CLK) before relaying to the next micro-driver. By combining the two options, the following 4 clock polarity options (e.g., single ended driving circuit 1600 in FIG. 16A, single ended alternating polarity in FIG. 16B, complementary driving in FIG. 16C, pseudo twisted pair in FIG. 16D) may be supported, e.g., to compare EMI performance. Note that for the single-ended alternating polarity and the pseudo twisted pair, every other micro-driver (e.g., odd or even columns) may utilize an inverted, incoming EM_CLK, for example, including an option to invert the incoming EM_CLK (e.g., IN_POL_SWAP_EN).

Figure 17:
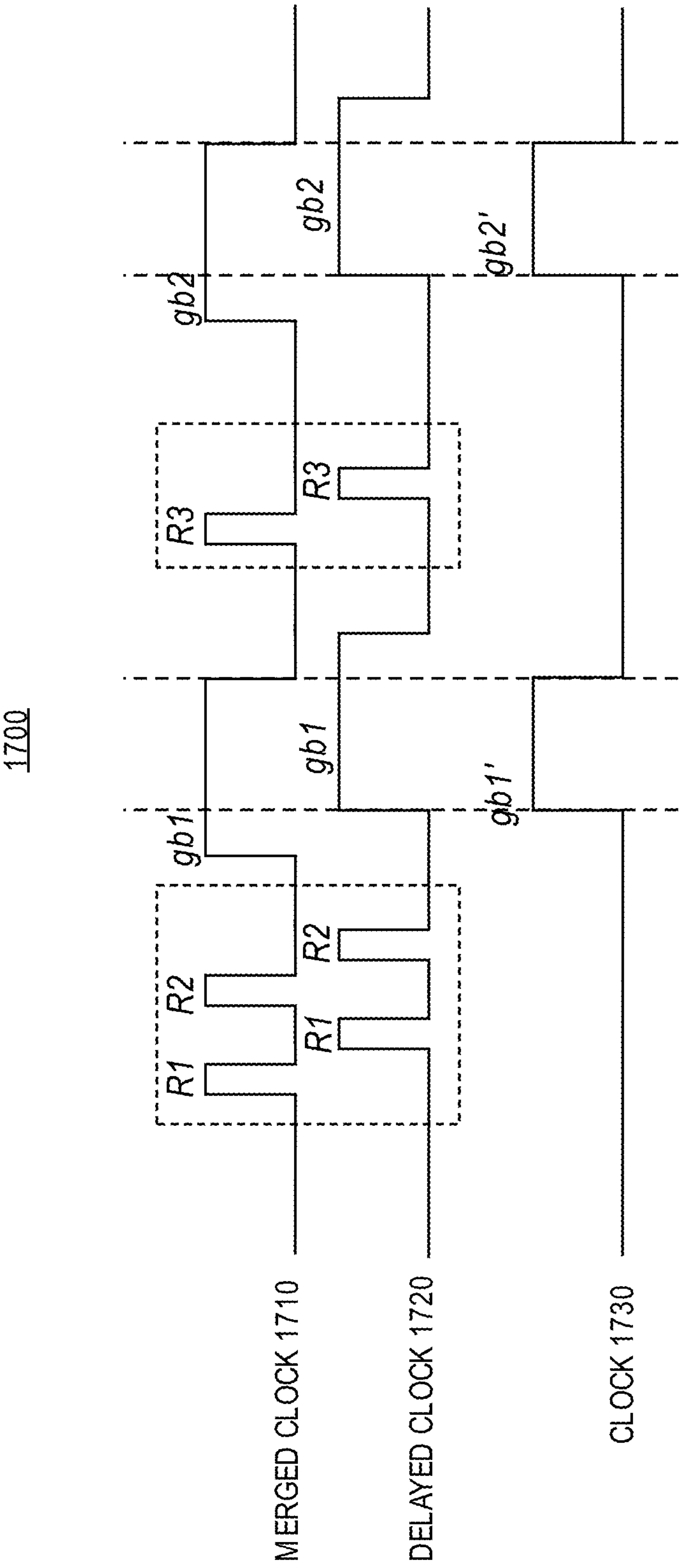
FIG. 17 is an emission pulse width modulation (PWM) control timing diagram according to an alternative embodiment of the disclosure.

FIG. 17 is an emission pulse width modulation (PWM) control timing diagram according to an alternative embodiment of the disclosure. Each (e.g., unit cell or other grouping of a) micro-driver may utilize a single gray level (e.g., emission (EM)) counter for a single merged clock signal. Alternatively, each micro-driver may include a counter for each color of a pixel array. In one example, a merged clock signal 1710 includes pulses R1-R3 of a clock signal for causing emission of red display elements and also pulses GB1 and GB2 for causing emission of green and/or blue display elements. Each pulse corresponds to a different gray scale level. For example, the pulse R1 corresponds to a gray scale level 1 for a red display element. The pulse GB1 corresponds to a gray scale level 1 for a green and/or blue display element. In this example, the merged clock signal 1710 includes a certain number (e.g., 512, 768) of rising edges for capturing the original red and green/blue clock signals. Driver circuitry (e.g., micro-driver) receives the merged clock signal 1710 and includes logic for separating or extracting the original red and green/blue clock signals.

In one example, a delay cell delays the merged clock signal 1710 and generates a delayed clock signal 1720. A logic function (e.g., XOR gate) can be applied to the signals 1710 and 1720. The logic function receives the signals 1710 and 1720 as inputs and generates an output clock signal 1730 that includes pulses GB1' and GB2' which are based on the GB1 and GB2 pulses. The original pulses R1-R3 (or modified version of these pulses) can then be determined when R1-R3 have a different pulse width in comparison to pulse widths of GB1 and GB2.

In another example, a merged clock signal includes individual pulses for red, blue, and green emission clock signals. The pulse widths of each of the emission clock signals would be different in order to extract or separate the individual clock signals from the merged clock signal.

Figure 18A:
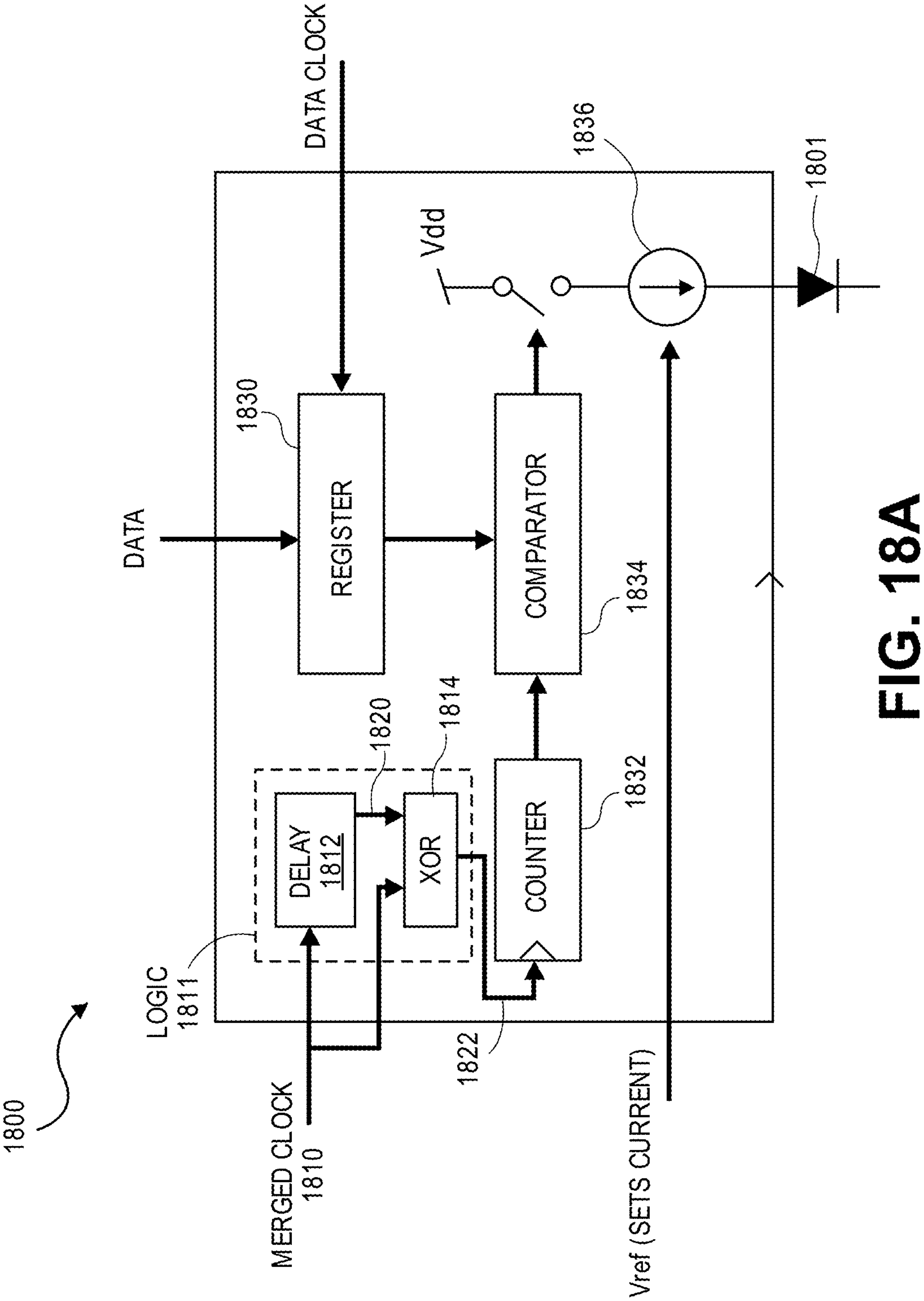
FIG. 18A is a unit cell 1800 of a driver circuitry (e.g., a micro-driver) according to an alternative embodiment of the disclosure.

FIG. 18A is a unit cell 1800 of a driver circuitry (e.g., a micro-driver) according to an alternative embodiment of the disclosure. A micro driver may include one or more unit cells. Depicted unit cell 1800 includes a register 1830 (e.g., digital data storage device) to store a data signal corresponding to the emission to be output from the display element (e.g., LED 1801). Data stored in a register may be referred to as digital data, e.g., in contrast to analog data stored in a capacitor. Data (e.g., video) signal may be loaded (e.g., stored) into the register by any method, for example, by being clocked in according to a data clock. In one embodiment, the data clock signal being active (e.g., logic level 1, goes high) allows data to enter the register and then the data is latched into the register when the data clock signal is inactive (e.g., logic level 0, goes low).

The unit cell 1800 of driver circuitry (e.g., micro-driver) receives the merged clock signal 1810 and includes logic 1811 for separating or extracting the original clock signals (e.g., first clock signal, second clock signal, third clock signal) that have been merged into the merged clock signal.

In one example, a delay cell 1812 delays the merged clock signal 1810 and generates a delayed clock signal 1820. A logic function (e.g., XOR logic function) can be applied to the signals 1810 and 1820. The logic function 1814 receives the signals 1810 and 1820 as inputs and generates a second clock signal 1822 or a clock signal that is based on the second clock signal). In one example, the second clock signal includes pulses of a green or blue clock signal for emitting green or blue display elements.

Non-linear gray scale clock signal 1822 (e.g., second or third clock signals) may increment the counter 1832. The gray scale clock may also reset the counter to its original value (e.g., zero). Separate counters (or unit cells) may be needed for each type of clock signal (e.g., red clock signal, green clock signal, blue clock signal). The logic 1811 may only be needed in a subset of the unit cells. The present design of merging clock signals and then separating the merged clock signal within the micro-driver does not require any data modification or manipulation of the data signals.

Unit cell 1800 also includes a comparator 1834. Comparator may compare a data signal from the register 1830 to a number of pulses from a (e.g., non-linear) gray scale clock counted by counter 1832 to cause an emission by display element (e.g., LED 1801), e.g., when the data signal differs from (e.g., or is greater or less than) the number of pulses from the non-linear gray scale clock. The comparator 1834 may cause a switch to activate a current source 1836 to cause the display element (e.g., LED 1801) to illuminate accordingly. A current source (e.g., adjusted via an input, such as, but not limited to a reference voltage (Vref)) may provide current to operate a display element (e.g., μLED) at its optimum current, e.g., for efficiency as described with regard to FIG. 1. A current source may have its current set by a control signal, such as a bias voltage setting the current, use of a (e.g., Vth) compensation pixel circuit, or adjusting a resistor of a constant current operational amplifier (op amp) to control the output of the op amp's current.

Figure 18B:
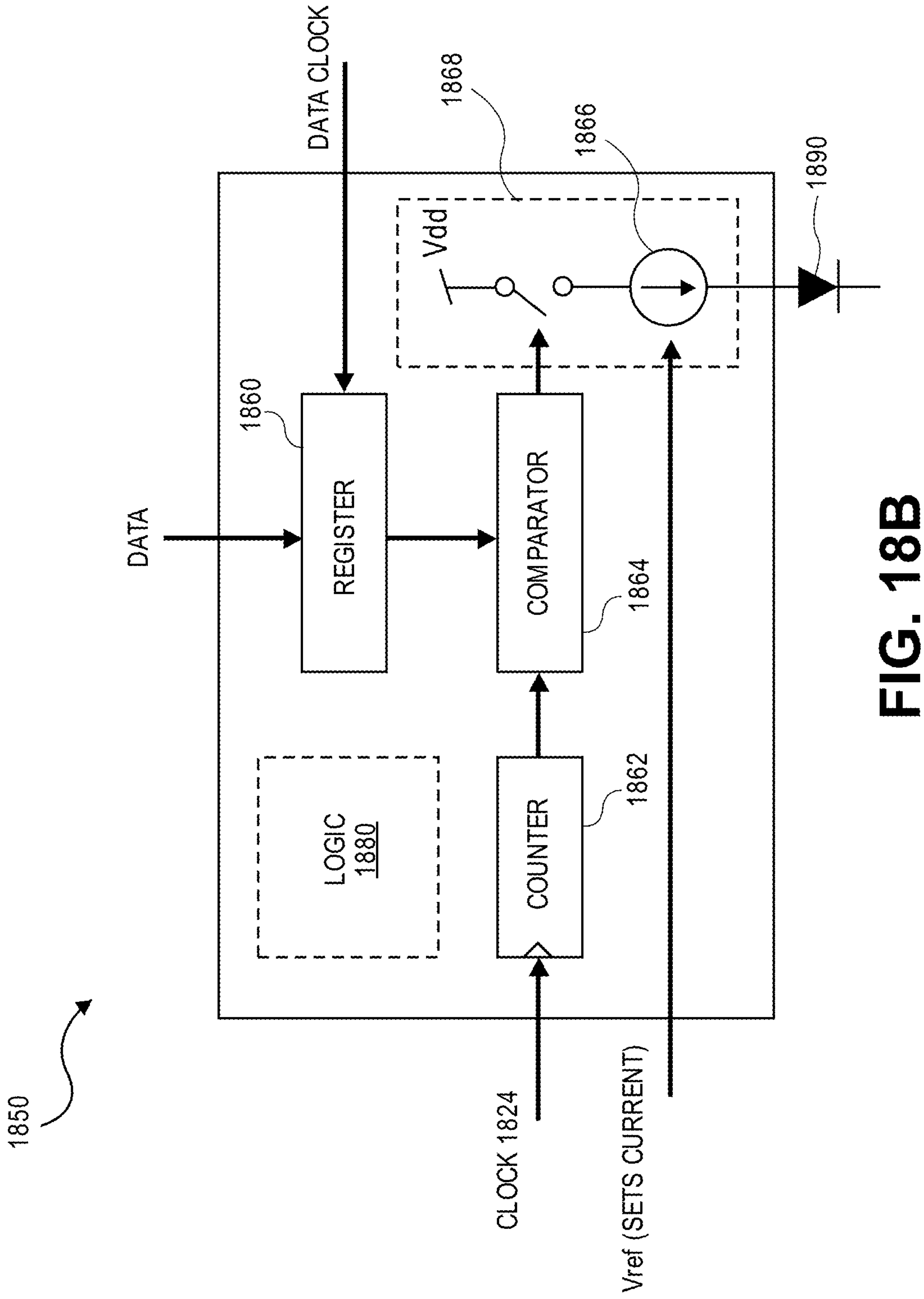
FIG. 18B is a unit cell 1850 of a driver circuitry (e.g., a micro-driver) according to an alternative embodiment of the disclosure.

The original pulses of a first clock signal or a clock signal that is based on the first clock signal can be determined when pulses of the first clock signal (e.g., pulses for causing emissions of red display elements) have a different pulse width in comparison to pulse widths of the second and third clock signals. The determined or derived first clock signal 1824 can be provided to a different counter of a unit cell 1870 of FIG. 18B in accordance with an alternative embodiment.

Comparator 1864 may compare a data signal (e.g., data signal for clock signal 1824) from the register 1860 to a number of pulses from the clock signal 1824 counted by counter 1862 to cause an emission by display element (e.g., LED 1890), e.g., when the data signal differs from (e.g., or is greater or less than) the number of pulses from the non-linear gray scale clock signal 1870. The comparator 1864 may cause a switch to activate a current source 1866 to cause the display element (e.g., LED 1890) to illuminate accordingly. A current source (e.g., adjusted via an input, such as, but not limited to a reference voltage (Vref)) may provide current to operate a display element (e.g., μLED) at its optimum current, e.g., for efficiency as described with regard to FIG. 1. A current source may have its current set by a control signal, such as a bias voltage setting the current, use of a (e.g., Vth) compensation pixel circuit, or adjusting a resistor of a constant current operational amplifier (op amp) to control the output of the op amp's current. The unit cell 1850 may optionally include logic 1880 for separating the clock signal 1824 from the merged clock signal 1810 based on knowing different pulse widths of the individual clock signals of the merged clock signal 1810 if other logic (e.g., logic 1811) has not determined the clock signal 1824.

The term “on” in connection with a device may generally refer to an activated state of the device, and the term “off” used in this connection may refers to a deactivated state of the device. The term “on” used in connection with a signal received by a device may generally refer to a signal that activates the device, and the term “off” used in this connection may generally refer to a signal that deactivates the device. A device may be activated by a high voltage or a low voltage, depending on the underlying principles implementing the device.

Hybrid MicroDriver Display System

Figure 19:
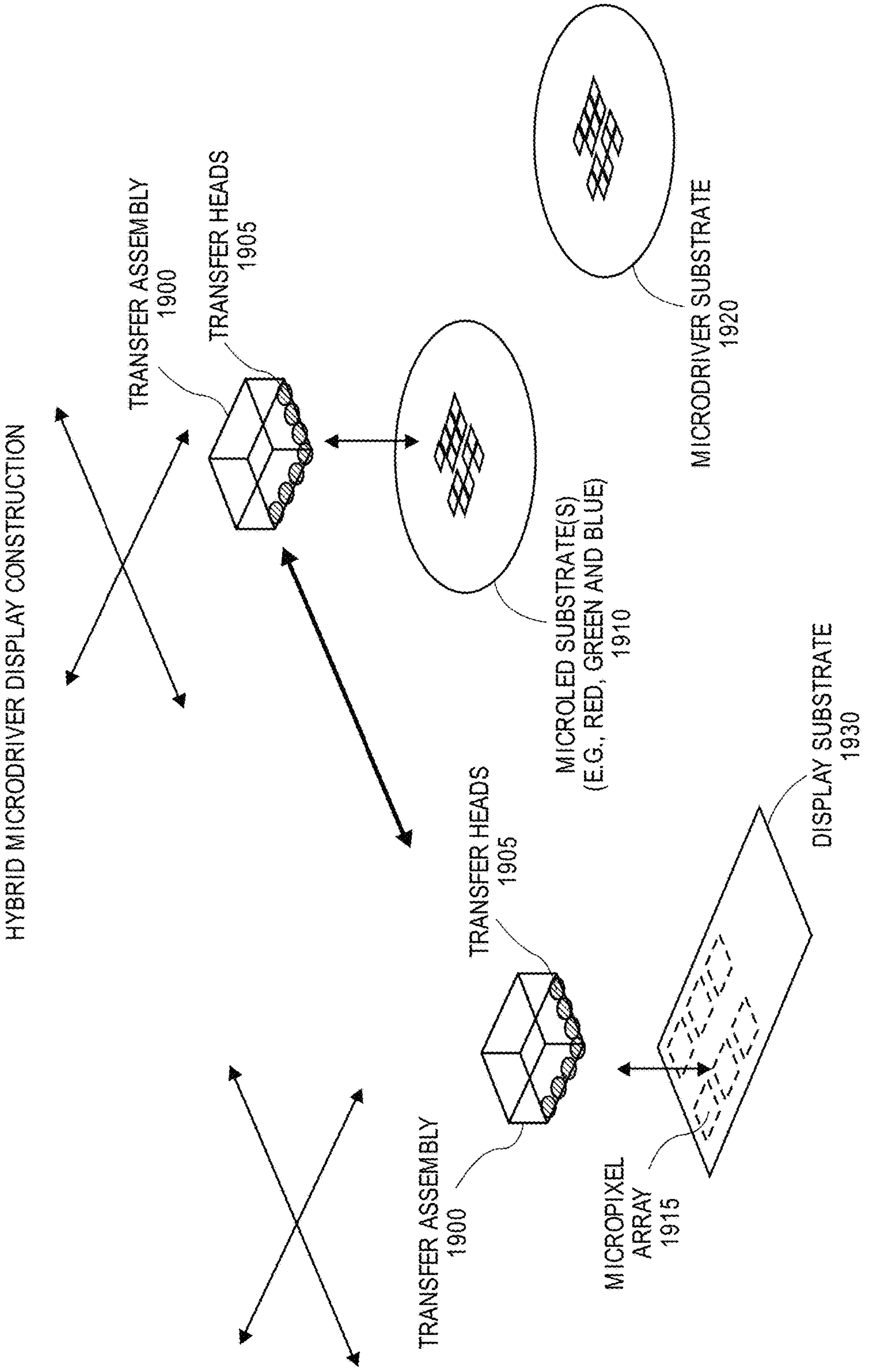
FIG. 19 illustrates the processing of substrates of μDriver and μLEDs into a receiving substrate for a hybrid μDriver and μLED display, according to an embodiment.

FIG. 19 illustrates the processing of substrates of μDriver and μLEDs into a receiving substrate for a hybrid μDriver and μLED display, according to an embodiment. In one embodiment, separate carrier substrates include one or more μLED substrate(s) 1910 and a μDriver substrate 1920. One or more transfer assemblies 1900 can be used to pick up and transfer microstructures from the carrier substrates (e.g., 1910, 1920) to the receiving display substrate 1930.

In one embodiment, separate transfer assemblies 1900 are used to transfer any combination of μLED colors from the μLED substrate 1910 and μDriver substrate 1920. In one embodiment the display substrate 1930 is prepared with distribution lines to connect the various the μLED and μDriver structures. The display substrate can also be prepared with one or more layers of TFT components as described herein. The distribution lines can be coupled to landing pads and an interconnect structure to electrically couple the μLED devices, the μC devices, and the TFT components. The interconnect structure can also be designed to couple the various μC devices to each other to create a μDriver relay to enable communication between the μDriver ICs. The receiving substrate can be a display substrate 1930 of any size ranging from micro displays to large area displays, can be a lighting substrate for LED lighting, or for use as an LED backlight for an LCD display. In one embodiment the μLED and μDriver structures are bonded to the same side of the substrate surface. However, the μDriver and μLED structures may also be bonded to alternate sides of the substrate surface.

The μDriver and μLEDs are described herein as coupling to a substrate via connection pads. However, the bonds between the components can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, heat and/or pressure can be transferred from the array of transfer heads 1905 to facilitate bonding. In an embodiment, conductive contacts on the μC, μLED devices, or other display components (e.g., sensor devices) are thermocompression bonded to conductive pads on the substrate. In this manner, the bonds may function as electrical connections to the μDriver IC and μLED devices. In one embodiment bonding includes indium alloy bonding or gold alloy bonding. Other exemplary bonding methods that may be utilized with embodiments include, but are not limited to, thermal bonding and thermosonic bonding.

The specifics of the display substrate 1930 can vary based on the target application. In one embodiment the display substrate 1930 is used to form a microPixel array 1915 for use in a high-resolution display. In one embodiment the microPixel array 1915 can have up to 440 pixels per inch, although other embodiments may be manufactured at higher PPIs.

Figure 20:
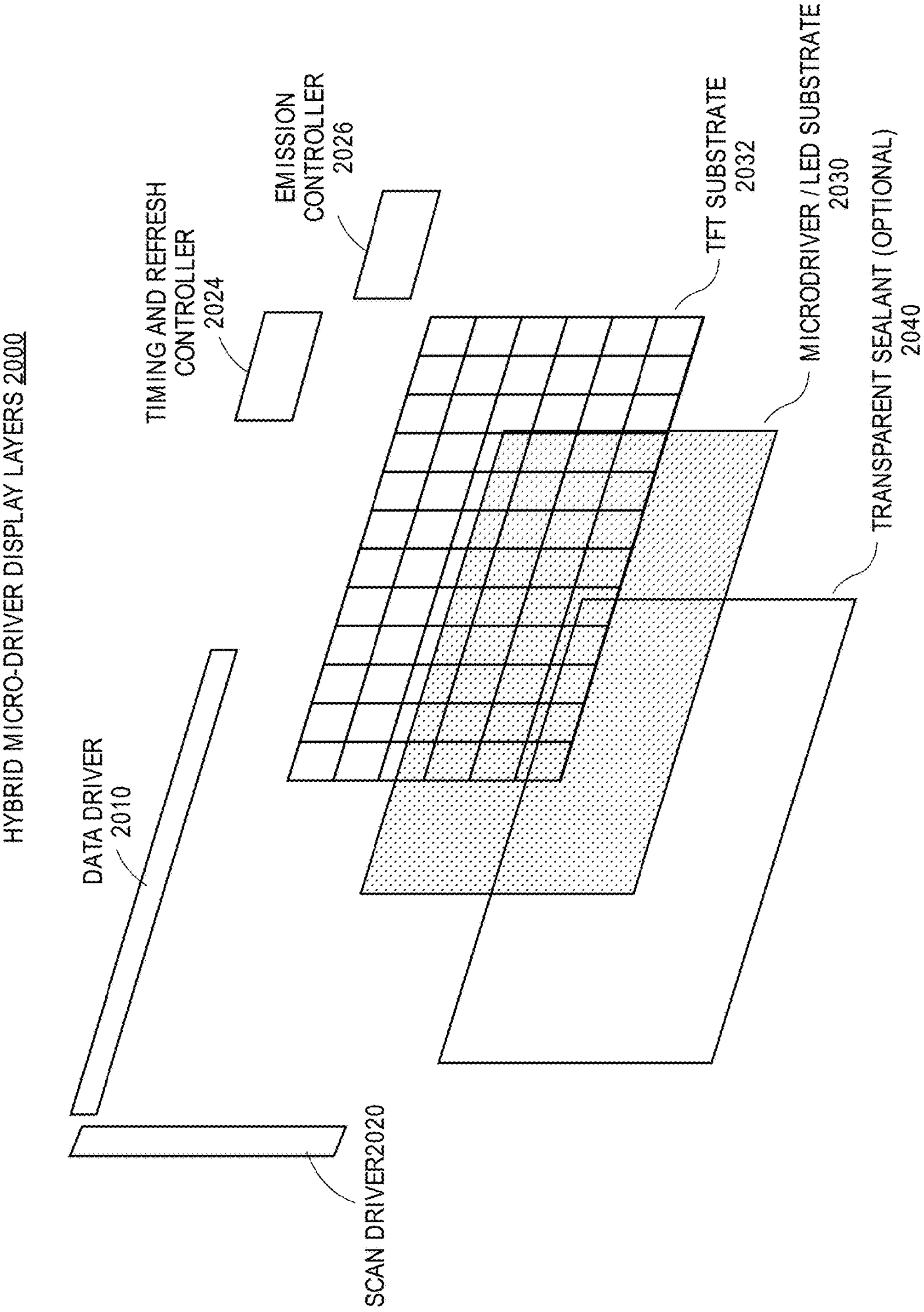
FIG. 20 is an illustration of layers 2000 of a hybrid micro-driver display, according to an embodiment.

FIG. 20 is an illustration of layers 2000 of a hybrid micro-driver display, according to an embodiment. In one embodiment, a μDriver and LED receiving substrate is a micro-matrix 2030 that is prepared with distribution lines to couple the micro-matrix of μDriver IC devices and LEDs (e.g., μLEDs, OLEDs, etc.) to one or more display controllers. In one embodiment, the receiving substrate 2030 is a display substrate, and multiple assemblies including μLEDs and μDriver ICs interconnect to form a high-resolution display system. In one embodiment a TFT substrate 2032 including LTPS and/or Oxide transistors and capacitors couple to the μDriver/LED substrate 2030. An optional sealant 2040 can be used to secure and protect the substrate. In one embodiment, the sealant is transparent, to allow a display or lighting substrate with top emission LED devices to display through the sealant. In one embodiment, the sealant is opaque, for use with bottom emission LED devices. In one embodiment an optional data driver 2010 and a scan driver 2020 couple with multiple data and scan lines on the display substrate. In one embodiment, each of the smart-pixel devices couple with a refresh and timing controller 2024. The refresh and timing controller 1204 can address each LED device individually, to enable asynchronous or adaptively synchronous display updates. In one embodiment, an emission controller 2026 can couple with the micro-driver/LED substrate 2030 to control the brightness of LEDs, for example, via manipulation of emission control inputs. In one embodiment the emission controller 2026 can couple with one or more optical sensors to allow adaptive adjustment of emission pulse length based on ambient light conditions. The emission controller 2026 can adjust display brightness via manipulation of initial and reference voltages.

A display system may include a receiver to receive display data from outside of the display system. The receiver may be configured to receive data wirelessly, by a wire connection, by an optical interconnect, or any other connection. The receiver may receive display data from a processor via an interface controller. In one embodiment, the processor may be a graphics processing unit (GPU), a general-purpose processor having a GPU located therein, and/or a general-purpose processor with graphics processing capabilities. The display data may be generated in real time by a processor executing one or more instructions in a software program, or retrieved from a system memory. A display system may have any refresh rate, e.g., 50 Hz, 60 Hz, 100 Hz, 120 Hz, 200 Hz, or 240 Hz.

Depending on its applications, a display system may include other components. These other components include, but are not limited to, memory, a touch-screen controller, and a battery. In various implementations, the display system may be a television, smart watch, wearable device, tablet, phone, laptop, computer monitor, automotive heads-up display, automotive navigation display, kiosk, digital camera, handheld game console, media display, ebook display, or large area signage display.

Figure 21:
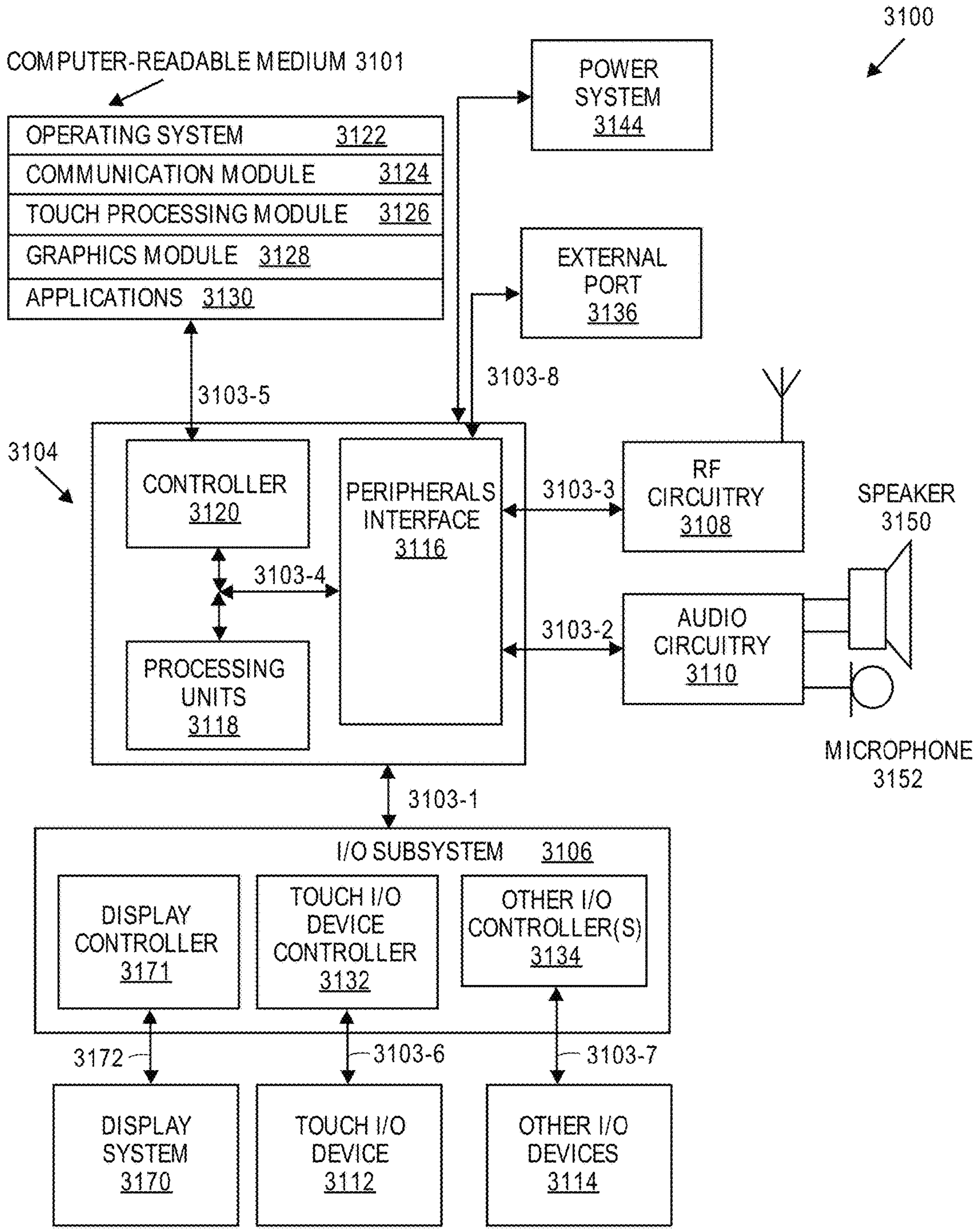
FIG. 21 is a block diagram of one embodiment of the present invention of system 3100 that generally includes one or more computer-readable mediums 3101, processing system 3104, Input/Output (I/O) subsystem 3106, radio frequency (RF) circuitry 3108 and audio circuitry 3110.
Figure 22:
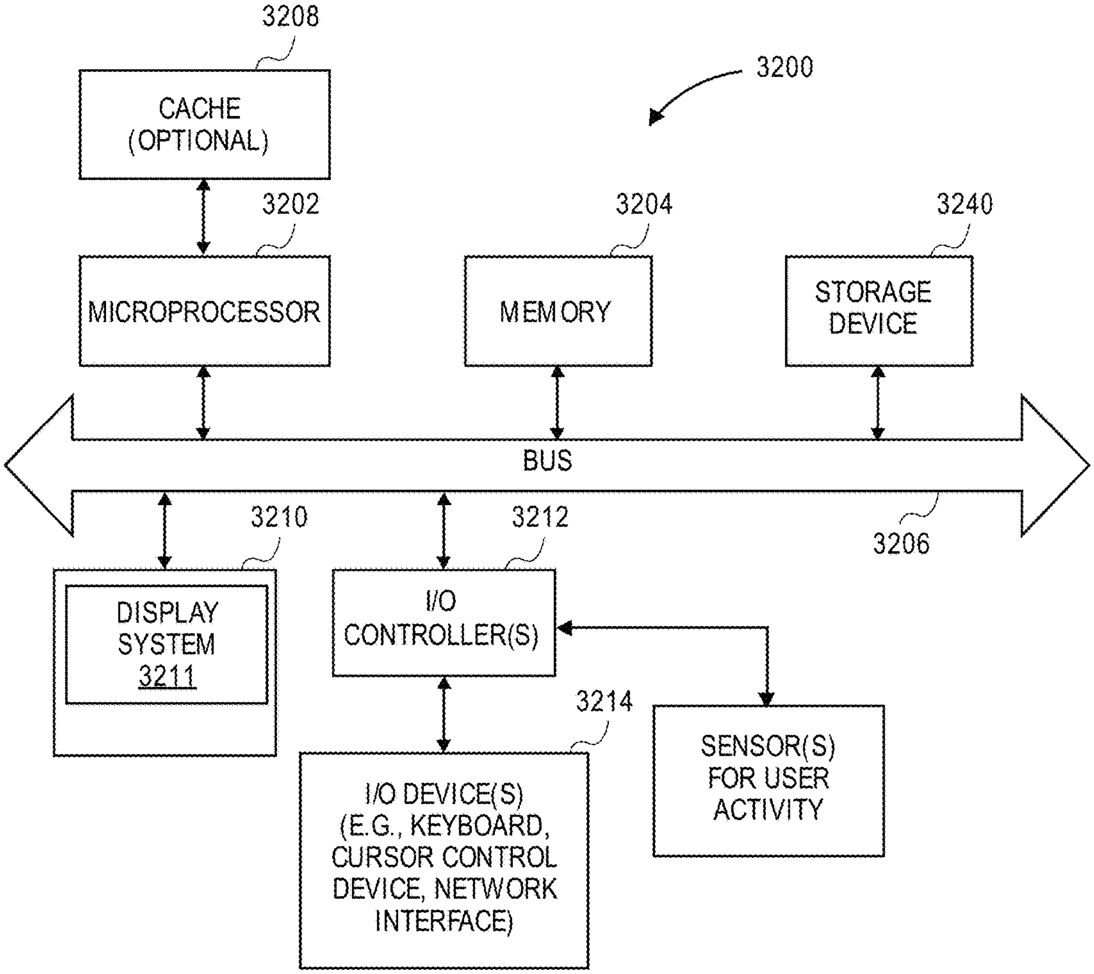
FIG. 22 shows another example of a device according to an embodiment of the disclosure.

In some embodiments, the methods, systems, and apparatuses of the present disclosure can be implemented in various devices including electronic devices, consumer devices, data processing devices, desktop computers, portable computers, wireless devices, cellular devices, tablet devices, display screens, televisions, handheld devices, multi touch devices, multi touch data processing devices, wearable devices, any combination of these devices, or other like devices. FIGS. 21 and 22 illustrate examples of a few of these devices.

Attention is now directed towards embodiments of a system architecture that may be embodied within any portable or non-portable device including but not limited to a communication device (e.g., mobile phone, smart phone, smart watch, wearable device), a multi-media device (e.g., MP3 player, TV, radio), a portable or handheld computer (e.g., tablet, netbook, laptop), a desktop computer, an All-In-One desktop, a peripheral device, a television, or any other system or device adaptable to the inclusion of system architecture 3100, including combinations of two or more of these types of devices.

FIG. 21 is a block diagram of one embodiment of the present invention of system 3100 that generally includes one or more computer-readable mediums 3101, processing system 3104, Input/Output (I/O) subsystem 3106, radio frequency (RF) circuitry 3108 and audio circuitry 3110. These components may be coupled by one or more communication buses or signal lines 3103 (e.g., 3103-1, 3103-2, 3103-3, 3103-4, 3103-5, 3103-6, 3103-7, 3108-8).

It should be apparent that the architecture shown in FIG. 31 is only one example architecture of system 3100, and that system 3100 could have more or fewer components than shown, or a different configuration of components. The various components shown in FIG. 31 can be implemented in hardware, software, firmware or any combination thereof, including one or more signal processing and/or application specific integrated circuits.

RF circuitry 3108 is used to send and receive information over a wireless link or network to one or more other devices and includes well-known circuitry for performing this function. RF circuitry 3108 and audio circuitry 3110 are coupled to processing system 3104 via peripherals interface 3116. Interface 3116 includes various known components for establishing and maintaining communication between peripherals and processing system 3104. Audio circuitry 3110 is coupled to audio speaker 3150 and microphone 3152 and includes known circuitry for processing voice signals received from interface 3116 to enable a user to communicate in real-time with other users. In some embodiments, audio circuitry 3110 includes a headphone jack (not shown).

Peripherals interface 3116 couples the input and output peripherals of the system to processing units 3118 and computer-readable medium 3101. One or more processing units 3118 communicate with one or more computer-readable mediums 3101 via controller 3120. Computer-readable medium 3101 can be any device or medium (e.g., storage device, storage medium) that can store code and/or data for use by one or more processing units 3118. Medium 3101 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 3101 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processing units 3118 run various software components stored in medium 3101 to perform various functions for system 3100. In some embodiments, the software components include operating system 3122, communication module (or set of instructions) 3124, touch processing module (or set of instructions) 3126, graphics module (or set of instructions) 3128, and one or more applications (or set of instructions) 3130. In some embodiments, medium 3101 may store a subset of the modules and data structures identified above. Furthermore, medium 3101 may store additional modules and data structures not described above.

Operating system 3122 includes various procedures, sets of instructions, software components and/or drivers for controlling and managing general system tasks (e.g., memory management, storage device control, power management, etc.) and facilitates communication between various hardware and software components.

Communication module 3124 facilitates communication with other devices over one or more external ports 3136 or via RF circuitry 3108 and includes various software components for handling data received from RF circuitry 3108 and/or external port 3136.

Graphics module 3128 includes various known software components for rendering, animating and displaying graphical objects on a display surface. In embodiments in which touch I/O device 3112 is a touch sensitive display (e.g., touch screen), graphics module 3128 includes components for rendering, displaying, and animating objects on the touch sensitive display. The display controller 3171 and display system 3170 of the present design may be implemented in at least one of the touch I/O device and the touch I/O device controller or may be located as separate components as illustrated in FIG. 21. The display controller and display system are coupled via communication link 3172.

One or more applications 3130 can include any applications installed on system 3100, including without limitation, a game center application, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 3126 includes various software components for performing various tasks associated with touch I/O device 3112 including but not limited to receiving and processing touch input received from I/O device 3112 via touch I/O device controller 3132.

FIG. 22 shows another example of a device according to an embodiment of the disclosure. This device 3200 may include one or more processors, such as microprocessor(s) 3202, and a memory 3204, which are coupled to each other through a bus 3206. The device 3200 may optionally include a cache 3208 which is coupled to the microprocessor(s) 3202. The device may optionally includes a storage device 3240 which may be, for example, any type of solid-state or magnetic memory device. Storage device 3240 may be or include a machine-readable medium.

This device may also optionally include a display controller and display device 3210 which is coupled to the other components through the bus 3206. The display system (or display driver hardware circuit) 3211 of the present design may be implemented in the display controller and display device 3210.

One or more input/output controllers 3212 are also coupled to the bus 3206 to provide an interface for input/output devices 3214 and to provide an interface for one or more sensors 3216 which are for sensing user activity. The bus 3206 may include one or more buses connected to each other through various bridges, controllers, and/or adapters as is well known in the art. The input/output devices 3214 may include a keypad or keyboard or a cursor control device such as a touch input panel. Furthermore, the input/output devices 3214 may include a network interface which is either for a wired network or a wireless network (e.g. an RF transceiver). The sensors 3216 may be any one of the sensors described herein including, for example, a proximity sensor or an ambient light sensor. In at least certain implementations of the device 3200, the microprocessor(s) 3202 may receive data from one or more sensors 3216 and may perform the analysis of that data in the manner described herein.

In certain embodiments of the present disclosure, the device 3200 or device 3100 or combinations of devices 3100 and 3200 can be used to drive display data to a display device and implement at least some of the methods discussed in the present disclosure.

In utilizing the various embodiments of this disclosure, it would become apparent to one skilled in the art that combinations or variations of the above embodiments are possible for controlling emission of a display panel. Although the present disclosure has been described in language specific to structural features and/or methodological acts, it is to be understood that the disclosure defined in the appended claims is not necessarily limited to the specific features or acts described. The specific features and acts disclosed are instead to be understood as particularly graceful implementations of the claimed disclosure useful for illustrating the present disclosure.

What is claimed is:

1. A display driver hardware circuit comprising:

decoder logic to store a mapping between a plurality of non-linear gray scale clock signals and a merged non-linear gray scale clock signal that represents a combination of the plurality of non-linear gray scale clock signals including first and second non-linear gray scale clock signals with the first non-linear gray scale clock signal being associated with at least one display element of a first color and the second non-linear gray scale clock signal being associated with at least one display element of a second color; and driver circuitry coupled to the decoder logic, the driver circuitry includes a counter to store a number of pulses of the merged non-linear gray scale clock signal and driving circuitry to cause emission of the at least one display element of a first color based on the first non-linear gray scale clock signal.

2. The display driver hardware circuit of claim 1, wherein the first and second non-linear gray scale clock signals to each be represented with a first number of bits and the merged non-linear gray scale clock signal to be represented with a second number of bits.

3. The display driver hardware circuit of claim 1, wherein the driver circuitry further comprises:

a data register to store a modified data signal having a first set of data and a second set of data; and a comparator to compare the modified data signal from the data register to a number of pulses of the merged non-linear clock signal, wherein the driving circuitry, in response to output of the comparator, to cause the emission of the at least one display element of a first color and to cause an emission of the at least one display element of a second color.

4. The display driver hardware circuit of claim 1, wherein the plurality of non-linear gray scale clock signals further includes a third non-linear gray scale clock signal that is associated with a display element of a third color.

5. The display driver hardware circuit of claim 4, wherein the merged non-linear gray scale clock signal further includes pulses of the third non-linear gray scale clock signal.

6. The display driver hardware circuit of claim 1, wherein adjacent display elements are multiple rows and multiple columns of a display panel.

7. A micro-driver hardware circuit comprising:

a counter to receive a merged non-linear gray scale clock signal that represents a combination of a plurality of non-linear gray scale clock signals including first and second non-linear gray scale clock signals with each of the first and second clock signals being associated with a different color of display elements, the counter to store a number of pulses of the merged non-linear gray scale clock signal; and driving circuitry coupled to the counter, the driving circuitry to cause emissions of the display elements based on the merged non-linear gray scale clock signal.

8. The micro-driver hardware circuit of claim 7, wherein the first and second non-linear gray scale clock signals to each be represented with a first number of bits and the merged non-linear gray scale clock signal to be represented with a second number of bits.

9. The micro-driver hardware circuit of claim 7, further comprising:

a data register to store a modified data signal having at least a first set of data that is associated with the first non-linear gray scale clock signal and a second set of data that is associated with the second non-linear gray scale clock signal; and a comparator to compare the modified data signal from the data register to a number of pulses of the merged non-linear clock signal, wherein the driving circuitry, in response to output of the comparator, to cause an emission of at least one display element of a first color based on the first set of data and to cause an emission of at least one display element of a second color based on the second set of data.

10. The micro-driver hardware circuit of claim 7, wherein the plurality of non-linear gray scale clock signals further includes a third non-linear gray scale clock signal that is associated with a display element of a third color.

11. The micro-driver hardware circuit of claim 10, wherein the merged non-linear gray scale clock signal further includes pulses of the third non-linear gray scale clock signal.

12. A method to drive a display panel comprising:

counting a number of pulses of a merged non-linear gray scale clock that represents a combination of a plurality of non-linear gray scale clock signals including first and second non-linear gray scale clock signals with each of the first and second clock signals being associated with a different color of display elements of the display panel;

storing a modified data signal having a first set of data that is associated with the first non-linear gray scale clock signal and storing a second set of data that is associated with the second non-linear gray scale clock signal in a data register; and comparing the modified data signal from the data register to a number of pulses of the merged non-linear clock signal.

13. The method of claim 12, further comprising:

causing an emission of at least one display element of a first color based on the first set of data; and causing an emission of at least one display element of a second color based on the second set of data.

14. The method of claim 12, wherein the first and second non-linear gray scale clock signals to each be represented with a first number of bits and the merged non-linear gray scale clock signal to be represented with a second number of bits.

15. The method of claim 12, further comprising:

modifying a data signal that is represented with a first number of bits into the modified data signal that is represented with a second number of bits in order to identify the first set of data and the second set of data.

16. The method of claim 12, wherein the plurality of non-linear gray scale clock signals further includes a third non-linear gray scale clock signal that is associated with a display element of a third color.

17. A display system comprising:

row selection logic to select a number of rows in an emission group of display elements of a display panel;

decoder logic to store a mapping between a plurality of non-linear gray scale clock signals and a merged non-linear gray scale clock signal that represents a combination of the plurality of non-linear gray scale clock signals including first and second non-linear gray scale clock signals with each of the first and second clock signals being associated with a different color of display elements; and driver circuitry coupled to the decoder logic, the driver circuitry includes a counter to store a number of pulses of the merged non-linear gray scale clock signal and driving circuitry to cause emissions of the display elements based on the merged non-linear gray scale clock signal.

18. The display system of claim 17, wherein the first and second non-linear gray scale clock signals to each be represented with a first number of bits and the merged non-linear gray scale clock signal to be represented with a second number of bits.

19. The display system of claim 17, wherein the driver circuitry further comprises:

a data register to store a modified data signal having a first set of data and a second set of data;

a comparator to compare the modified data signal from the data register to a number of pulses of the merged non-linear clock signal, wherein the driving circuitry, in response to output of the comparator, to cause an emission of at least one display element of a first color and to cause an emission of at least one display element of a second color.

20. The display system of claim 17, wherein the plurality of non-linear gray scale clock signals further includes a third non-linear gray scale clock signal that is associated with a display element of a third color.

21. The display system of claim 17, wherein the row selection logic receives the merged non-linear gray scale clock signal and sends the merged non-linear gray scale clock signal to the driver circuitry.

22. A driver circuitry comprising:

logic to receive a merged non-linear clock signal, the logic for separating or extracting a plurality of non-linear clocks signals including first and second non-linear clock signals that have been merged into the merged non-linear clock signal; and a counter coupled to the logic, the counter to receive the second non-linear clock signal or a clock signal that is based on the second non-linear clock signal, the counter to store a number of pulses of the second non-linear clock signal or the clock signal that is based on the second non-linear clock signal; and a comparator coupled to the counter, the comparator to compare a data signal to a number of pulses of the second non-linear clock signal or the clock signal that is based on the second non-linear clock signal.

23. The driver circuitry of claim 22, further comprising: a driving circuitry coupled to the comparator, the driving circuitry, in response to output of the comparator, to cause emissions of at least one display element of a second color that is associated with the second non-linear clock signal.

24. The driver circuitry of claim 22, wherein the logic includes a delay cell to delay the merged clock signal and to generate a delayed clock signal.

25. The driver circuitry of claim 22, wherein the logic includes a logic function to be applied to the merged clock signal and the delayed clock signal, the logic function generates the second non-linear clock signal or a clock signal that is based on the second non-linear clock signal, wherein the second non-linear clock signal is associated with at least one display element of a second color.

26. The driver circuitry of claim 25, wherein the plurality of non-linear gray scale clock signals further includes a third non-linear gray scale clock signal that is associated with a display element of a third color.

* * * * *